(12) United States Patent
Pagani

(10) Patent No.: US 10,991,654 B2
(45) Date of Patent: Apr. 27, 2021

(54) INDUCTIVE CONNECTION STRUCTURE FOR USE IN AN INTEGRATED CIRCUIT

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 590 days.

(21) Appl. No.: 15/892,467

(22) Filed: Feb. 9, 2018

(65) Prior Publication Data

US 2018/0174964 A1   Jun. 21, 2018

Related U.S. Application Data

(62) Division of application No. 13/332,086, filed on Dec. 20, 2011, now Pat. No. 9,929,089.

(30) Foreign Application Priority Data

Dec. 20, 2010 (IT) .......................... VI2010A000341

(51) Int. Cl.
*H01L 27/06* (2006.01)
*H01J 17/00* (2006.01)
(Continued)

(52) U.S. Cl.
CPC ...... *H01L 23/5227* (2013.01); *G01R 31/3025* (2013.01); *H01L 23/66* (2013.01);
(Continued)

(58) Field of Classification Search
CPC ..... H01L 23/5225–5227; H01L 23/645; H01L 27/0288; H01L 28/10; H01L 2223/6655; H01L 2924/1206; H01L 2924/19042; H01L 2924/19051; H01L 2924/30107; H01L 2924/30111; H01L 23/5227; H01L 23/66; H01L 2924/181; H01L 2224/8592; H01L 2224/48139; H01L 2924/1461; H01L 2924/3025; H01L 2224/48465;
(Continued)

(56) References Cited

U.S. PATENT DOCUMENTS 3,986,255 A    10/1976  Mandal
7,656,262 B2 *  2/2010  Muto .................. H03H 7/42
                                                    336/200
(Continued)

FOREIGN PATENT DOCUMENTS

JP    2008205403 A    9/2008

OTHER PUBLICATIONS

IT Search Report and Written Opinion for IT VI2010A000341 dated Jul. 12, 2011 (4 pages).

*Primary Examiner* — Cuong B Nguyen
(74) *Attorney, Agent, or Firm* — Crowe & Dunlevy

(57) ABSTRACT

A pad forms a connection terminal suitable for coupling circuit elements integrated in a chip to circuits outside the chip itself. At least one inductor is provided for use in the reception/transmission of electromagnetic waves or for supplying the chip with power or both. The connection pad and inductor are combined in a structure which reduces overall occupied area. A magnetic containment structure surrounds the structure to contain a magnetic field of the inductor.

28 Claims, 21 Drawing Sheets

(51) Int. Cl.
  *H01L 23/522* (2006.01)
  *H01L 23/66* (2006.01)
  *G01R 31/302* (2006.01)
  *G01R 31/315* (2006.01)

(52) U.S. Cl.
  CPC .... *G01R 31/315* (2013.01); *H01L 2223/6677* (2013.01); *H01L 2224/16145* (2013.01); *H01L 2224/16225* (2013.01); *H01L 2224/4813* (2013.01); *H01L 2224/48137* (2013.01); *H01L 2224/48139* (2013.01); *H01L 2224/48145* (2013.01); *H01L 2224/48227* (2013.01); *H01L 2224/48465* (2013.01); *H01L 2224/48472* (2013.01); *H01L 2224/8592* (2013.01); *H01L 2924/1461* (2013.01); *H01L 2924/15192* (2013.01); *H01L 2924/15311* (2013.01); *H01L 2924/181* (2013.01); *H01L 2924/3025* (2013.01); *H01L 2924/30107* (2013.01)

(58) Field of Classification Search
  CPC ... H01L 2224/4813; H01L 2224/48472; H01L 2924/15311; H01L 2924/15192; H01L 2924/16145; H01L 2224/48227; H01L 2224/48137; H01L 2224/16225; H01L 2224/48145; H01L 2223/6677; G01R 31/3025; G01R 31/315
  See application file for complete search history.

(56) References Cited

U.S. PATENT DOCUMENTS

| | | |
|---|---|---|
| 2002/0179991 A1 | 12/2002 | Varrot et al. |
| 2004/0222506 A1 | 11/2004 | Wei et al. |
| 2005/0190035 A1 | 9/2005 | Wang |
| 2006/0151851 A1 | 7/2006 | Pillai et al. |
| 2007/0200146 A1 | 8/2007 | Onishi et al. |
| 2007/0268105 A1 | 11/2007 | Walls |
| 2008/0012097 A1 | 1/2008 | Takahashi et al. |
| 2008/0029845 A1 | 2/2008 | Shen |
| 2008/0265367 A1 | 10/2008 | Tan et al. |
| 2009/0085208 A1 | 4/2009 | Uchida |
| 2009/0224784 A1 | 9/2009 | Pagani et al. |
| 2010/0164671 A1 | 7/2010 | Pagani et al. |

* cited by examiner

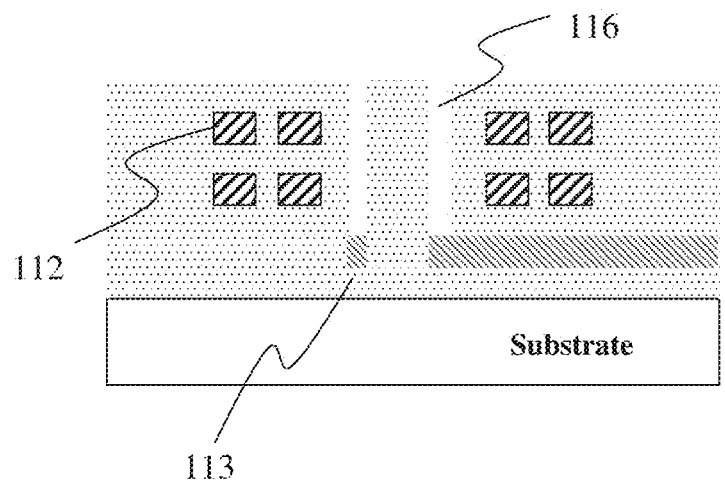
Fig. 9
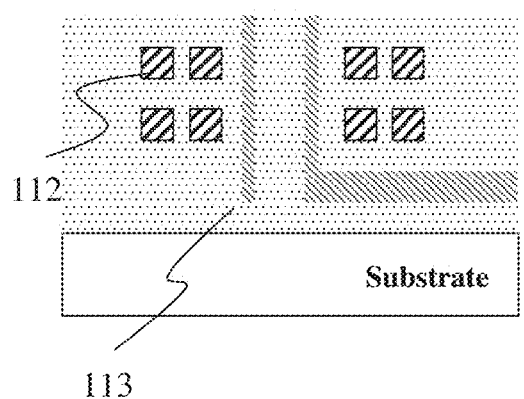 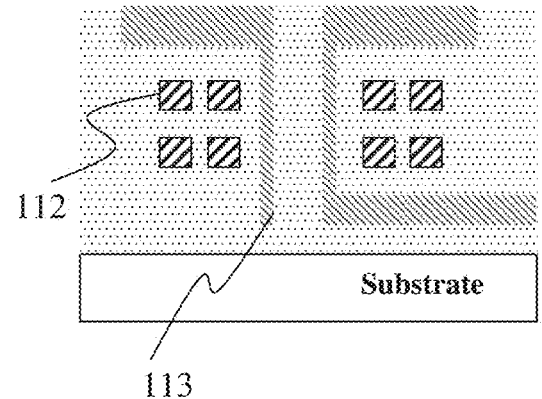
Fig. 10  Fig. 11

INDUCTIVE CONNECTION STRUCTURE FOR USE IN AN INTEGRATED CIRCUIT

CROSS REFERENCE TO RELATED APPLICATIONS

This application is a divisional of U.S. patent application Ser. No. 13/332,086, filed Dec. 20, 2011, which claims priority to Italian Patent Application No. VI2010A000341, filed Dec. 20, 2010, the disclosures of which are incorporated herein by reference in their entireties.

TECHNICAL FIELD

An embodiment refers to a connection structure having the function of a pad including an inductive element and suitable for being used during the testing step of electronic components in a substrate and/or as an active element in an integrated circuit. An embodiment also refers to a system including a connection structure and one or more circuit elements coupled to said connection structure. Finally, an embodiment refers to a method for creating said connection structure.

BACKGROUND

Thanks to the progress in the field of production processes of integrated electronic circuits, electronic components have become smaller, thus allowing the production of substrates including a large number of integrated circuits. It is also possible to produce compact electronic circuits including a large number of components and consequently the density of the connection terminals suitable for coupling the integrated electronic circuits has also drastically increased. The latest generation of devices thus has a large number of terminals or pads to place in contact, which have a small area and are often very close to one another.

The pads commonly used in the building of integrated circuits can have very complex and articulated mechanical structures. A structure for a pad suitable for reducing the risk of delamination and microfractures after high mechanical stresses of the assembly and checking process of the chip is described in United States Patent Application Publication No. 2002/0179991, which is incorporated by reference. In particular, the quoted document describes a pad having a reinforcement structure under the welding area. The reinforcement structure includes a layer of metal and metallic vias that couple the layer of metal to the lower surface of the upper metal layer.

The materials used for the pads are selected based on the applications of the semi-conductive chip. The increasing need for electronic applications capable of withstanding increasingly high temperatures has required the introduction of new materials for the pads and for the connections between the pads and the circuit elements forming part of the integrated circuit in order to ensure a good electrical connection. Moreover, the materials are selected also based on their mechanical characteristics so as to strengthen the pad itself. In some applications aluminum is thus replaced by materials like, for example, nickel, which has a greater hardness than aluminum.

Furthermore bumps can be created above the pads.

A possible structure for a connection bump is described in U.S. Pat. No. 3,986,255, which is incorporated by reference. This structure, since it is formed in part from magnetic materials, as well as ensuring an electrical connection, is also used to manually or automatically move the chip on a substrate and thus align the bumps of the chip with the contact areas of the substrate. A structure of this kind is, however, complex and thus expensive to make.

After having been formed in the substrate of a wafer, the integrated circuits must be tested so as to be able to identify defective components and, where possible, repair them.

The functionality of each integrated circuit in the substrate is checked by means of suitable probes that make contact with the connection terminals or pads of the integrated circuit itself that must be tested and that in the jargon is called DUT (Device Under Test). During the testing process, an ATE (Automatic Test Equipment) or tester is electrically coupled to the wafer on which the electronic components are formed. The interface between the ATE and the wafer is a probe card, including a PCB (printed circuit board) and a plurality of probes that electrically couple the ATE with the pads of the devices under test. In general, the wafer is arranged on a support called a chuck belonging to an apparatus called a prober.

Since the DUTs include a large number of pads close to one another, the correct alignment of the probes of the probe card with the corresponding pads during the testing step of the integrated circuits is of crucial importance.

FIG. 39 schematically illustrates a testing system for integrated circuits in which an electromagnetic interface is used to ensure the exchange of information between the ATE 1200 and the DUT 1100 through wireless communication based on electromagnetic probes. In these systems the ATE 1200 and the DUT 1100 include suitable transmitting and receiving circuits 1140, 1240 coupled to inductive antennae. The DUT 1100 can be fed inductively through the antennae, or else in the case in which the chip has high power consumption, the power supply can be provided through probes coupled to the pads of the DUT. To check the integrated circuits, "power line" type interfaces can also be used. In this case, a radio frequency signal can be superimposed on the power supply so that the communication between the ATE 1200 and the DUT 1100 occurs through the power line. An example of these systems is described in United States Patent Application Publication No. 2009/0224784, which is incorporated by reference.

The use of chips suitable for receiving/transmitting wirelessly requires the integration of inductive elements suitable for transmitting signals, for example, in radio frequency, into the substrate of the chip. A problem that must be tackled in producing systems on chips of this kind is the development of cost-effective processes and methods to create inductors and transformers that can be integrated in the substrate of the chip or coupled to it if external.

A way of making inductors and transformers coupled to an integrated circuit is described in United States Patent Application Publication No. 2008/0029845, which is incorporated by reference and which is schematically illustrated in FIG. 40. The idea is to use the inductance created by the connection wires 1300 or wire bonds that couple the different terminals 1110 on the surface of the chip together. Since the inductance created by the connection wires is typically insufficient to support applications like, for example, power converters, the connection wires can be covered with a magnetic coating 1316, like, for example, ferrite powder suspended in an epoxy resin, on a portion of the connection wire 1300 situated above the plane of the upper surface of the chip.

However, this solution is not very strong given that the inductive elements are arranged outside of the substrate and the magnetic coating can be subject to deterioration, thus causing a deterioration of the performance of the semi-conductor chip. In addition, the design of these inductive structures is greatly limited in the shape, size, and position of the inductive elements themselves, and this is also due to the size and number of chips on the substrate. Moreover, the inductive structures are created from connection wires outside of the chip being based on a wire bonding process, and, therefore, the various structures will have a greater variability of their characteristics than the inductive structures that can be integrated in the chip.

United States Patent Application Publication No. 2008/0265367, which is incorporated by reference, describes an integrated circuit including an inductive element and that can be magnetically aligned with a rewiring substrate, and such a structure is schematically illustrated in FIG. 41. In particular, the semi-conductive chip 2100 includes an alignment element that consists of an induction coil 2107 and a connection terminal 2108 that consists of a bump created above a pad. The coil 2107 is located below the contact terminals 2108 positioned at the corners of the semi-conductive chip 2100 and the alignment is carried out by inducing a magnetic field in the induction coil. The coil 2107 is arranged in a through hole 2137 of the semi-conductive chip and has a lateral dimension approximately equal to that of the connection terminal at the corner of the semi-conductive chip.

The contact terminal 2108 is, however, a dummy pad because it is located above a through hole 2137 containing the coil 2107 that is not coupled to the pad. Moreover, inside the coil 2107 there are no structures suitable for coupling the connection terminal 2108 to other circuits that are integrated in the chip 2100. The pad is finally coated with a ferromagnetic material that could even not be conductive. Consequently, the pad or corner bump of the semi-conductive chip described above can just be used to facilitate an optical alignment that is conventionally used for the chip itself with another element like, for example, a rewiring substrate, but it is not then used during the operation of the end product given that it is not coupled to the other circuits that are integrated in the chip 2100. Since the connection pads and the inductive elements are generally of substantial size, a substantial portion of the chip 2100 will remain unused during the operation of the chip in the final application, thus having a negative impact upon the size of the end product and on its cost.

Italian patent application TO 08A001014, which is incorporated by reference, describes a chip, illustrated in FIG. 42, including structures that can be coupled to a pad 3111 around which an antenna 3112 is formed. In this type of structure, the presence of the antenna 3112 around the pad 3111 requires the use of a substantial portion of volume of the substrate 3500 around the pad 3111.

A problem of the structure described above is that the inductive elements thus formed occupy a large portion of the substrate, thus causing an increase in the size of the integrated circuit itself with a consequent increase in costs.

Consequently, the structures described in the aforementioned documents belonging to the state of the art either are unsuitable for exchanging information with external apparatuses wirelessly, or else they describe structures with a design that is not very flexible, not very strong, or of substantial size.

In integrated circuits like the one described above, the pad is formed with conductive materials and, therefore, if an inductive element, like for example an antenna, is formed in the immediate vicinity of the pad, the inductor will influence the operation of the pad itself and vice versa. In general, the inductor will have problems working correctly as the operating frequency of the integrated circuit increases, following the eddy currents induced in the conductive material itself. Moreover, the force lines of the magnetic field induced by the inductive element can disturb the circuits adjacent to the inductor. For this reason, in conventional integrated circuits it is common practice to avoid forming the inductive elements in the vicinity of the electric/electronic circuits integrated in the substrate and it is a goal to reduce to the minimum the structures in the pad that could create parasitic inductances.

In the structure described in United States Patent Application Publication No. 2008/0265367, which is incorporated by reference, and as schematically illustrated in FIG. 41, indeed, the inductive element is situated at the edges of the substrate and coupled to a dummy pad, i.e. that is not electrically coupled to any circuit structure integrated in the substrate. Since the inductive element is not coupled to any integrated circuit element suitable for transmitting, it cannot be used as receiver/transmitter and can, therefore, only be used to align the integrated circuit with a structure outside of it, like for example a rewiring circuit, during the steps of the assembly process of the integrated circuit itself.

The design described above thus needs space to be reserved on the surface and inside the substrate for a structure that can only be used in the production step of the integrated circuit, thus contributing to drastically increasing the size of the integrated circuit and its cost.

SUMMARY

Given the aforementioned problems with the existing technology, an embodiment is a connection structure for use in an integrated circuit in which the inductive elements can be integrated so as to reduce the substrate space used so as to have a chip suitable for communicating with external apparatuses wirelessly, which is small in size and can be designed flexibly according to the particular requirements of the application of the integrated circuit.

An embodiment consists of making a connection structure for an integrated circuit including at least one inductive element so as to have a connection structure that has the functionalities of a connection terminal, like a pad, and the functionality of an inductive element.

According to an embodiment, a connection structure is provided that is suitable for being used in an integrated circuit having a plurality of metallization layers. Said connection structure includes a connection terminal on the upper metallization layer and able to be electrically coupled to circuit elements in the integrated circuit. The connection structure also includes a conductive element coupled to said connection terminal and suitable for coupling the connection terminal to one or more circuit elements of the integrated circuit. Finally, the connection structure includes an inductive element under the upper metallization layer where said inductive element can be electrically coupled to the connection terminal and to circuit elements outside the connection structure.

According to an embodiment, the inductive element is integrated in a connection structure, like a pad, which exists and is used during the operation of the integrated circuit. In this way, it is possible to save a substantial amount of the area of the substrate. Moreover, since both the connection terminal and the inductor can be coupled to one another and to other circuit elements of the chip, such structures can be used, as well as in the checking step of the chip, also during the operation of the final application in which the chip is used.

An embodiment is a system including an integrated circuit having the connection structure described above and a testing device including at least one probe. The probe includes a magnetic material and an inductive probe element and is suitable for being coupled to the connection structure both by making contact with the connection terminal and through a magnetic flux between the inductive element of the connection structure and the inductive probe element.

An embodiment is a method for making a connection structure for an integrated circuit including an inductive element. Said method includes creating a trench inside the inductor, depositing a magnetic and conductive material in the trench so that it is a conductive structure and so as to also form a magnetic element inside the trench itself and a connection terminal on the upper layer of the integrated circuit.

BRIEF DESCRIPTION OF THE DRAWINGS

The attached figures are incorporated into the description and form part thereof in order to illustrate different embodiments. The aforementioned figures together with the description are to explain the embodiments and related principles. The figures are provided for illustrating examples and embodiments, and should not be interpreted to limit the present disclosure to just the embodiments illustrated and described. Characteristics and advantages will become clear from the following and more detailed description of the different embodiments, as illustrated in the attached figures, in which the same numbers refer to the same elements.

FIGS. 9 to 13 are schematic drawings illustrating a process for making a connection structure for an integrated circuit according to an embodiment;

DETAILED DESCRIPTION

In the following description, for explanatory purposes specific details are provided in order to allow a clear understanding of disclosed concepts. However, it is clear that embodiments can be made without using such specific details. Moreover, well-known structures and components are only described in their general form so as to make their description easier.

A problem forming the basis of an embodiment is based on the need to produce microelectronic components of increasingly small size, reducing the costs.

Moreover, an embodiment is based on the observation that with the progress of photolithographic technology, the substrates for integrated circuits, such as wafers including integrated circuits, include a constantly increasing number of connection structures or pads arranged very close to one another. Moreover, during the assembly step of integrated circuits, the chip can be magnetically aligned with external elements and to do this the integrated circuits to be coupled include inductive or magnetic elements. Such inductive elements can also interfere with the correct operation of the circuit elements present in the integrated circuit and therefore such elements are integrated in dedicated areas of the integrated circuit. This means that a substantial area of the integrated circuit is occupied by the inductive structures that can be used for alignment and that will no longer be used once the integrated circuit is mounted in the end product. This of course limits the possibility of reducing the size of the integrated circuit.

In addition, recently produced integrated circuits are designed to include wireless functionality and, therefore, include inductive elements capable of emitting electromagnetic waves. Conventional circuits of this kind are, however, designed so as to integrate the inductive elements in dedicated areas, separate from the other circuit elements of the integrated circuit.

According to an embodiment, the inductive elements are integrated in the structure of a normal connection pad used to couple circuit elements of the integrated circuit with other circuits in the integrated circuit itself or with external systems and apparatuses.

Figure 1:
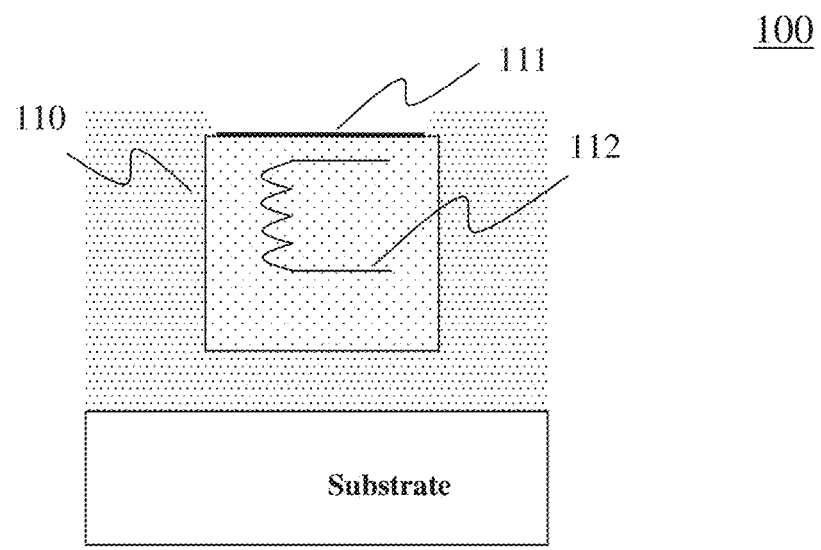
FIG. 1 is a schematic drawing illustrating a portion of an integrated circuit including a connection structure according to an embodiment.

FIG. 1 illustrates a longitudinal section of a portion of an integrated circuit or chip 100 including a connection structure or LPAD 110 suitable for coupling circuit elements of the integrated circuit with circuits external to it. The connection structure includes an inductive element 112 and a connection terminal or pad 111. Moreover, the connection structure includes a conductive element (not shown) coupled to the connection terminal itself. The conductive element couples the connection terminal 111 or pad to other circuits (not shown) present in the chip 100 that can be inside or outside the connection structure. The inductor 112 can in turn also be coupled to the terminal 111 or to circuits of the chip 100 outside the connection structure 110.

Figure 2:
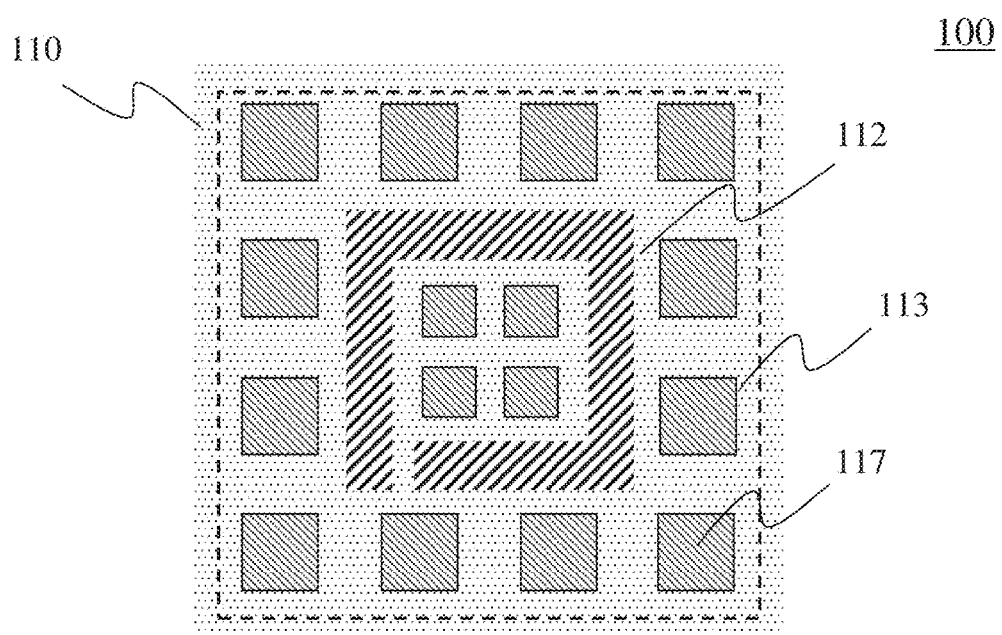
FIG. 2 is a schematic drawing illustrating a cross section of a connection structure used in the integrated circuit of FIG. 1 according to an embodiment.

FIG. 2 shows a cross section of an embodiment of the connection structure 110 for an integrated circuit 100. The connection structure 110 includes the inductive element 112 that can be shaped like a coil and the conductive element in the form of a discontinuous metal layer 113. The discontinuous metal layer 113 forms a plurality of sub-structures 117 that can be insulated from one another by an insulating material, like for example an oxide or a dielectric material. The coil 112 extends in the spaces of insulating material between the sub-structures 117 of the discontinuous layer of metal. The coil can have one or more sub-structures 117 inside of it and can also be surrounded on the outside by a plurality of sub-structures 117.

The use of a discontinuous structure makes it possible to create open circuits (the discontinuities of the metal layer) that interrupt the path of the induced currents. This prevents eddy currents from occurring in the connection structure 110. The connection structure 110 can, therefore, include conductive materials situated in the vicinity of the inductor 100, without such an inductor 112 having problems working correctly due to the eddy currents induced by the coils 112 in the conductive material of the connection structure 110.

The sub-structures 117 also perform a mechanical function to allow the connection structure 110 to withstand mechanical stresses, for example during the testing and assembly process of the chip 100.

The shape and size of the sub-structures 117 and of the inductive element 112 are not limited.

Figure 3:
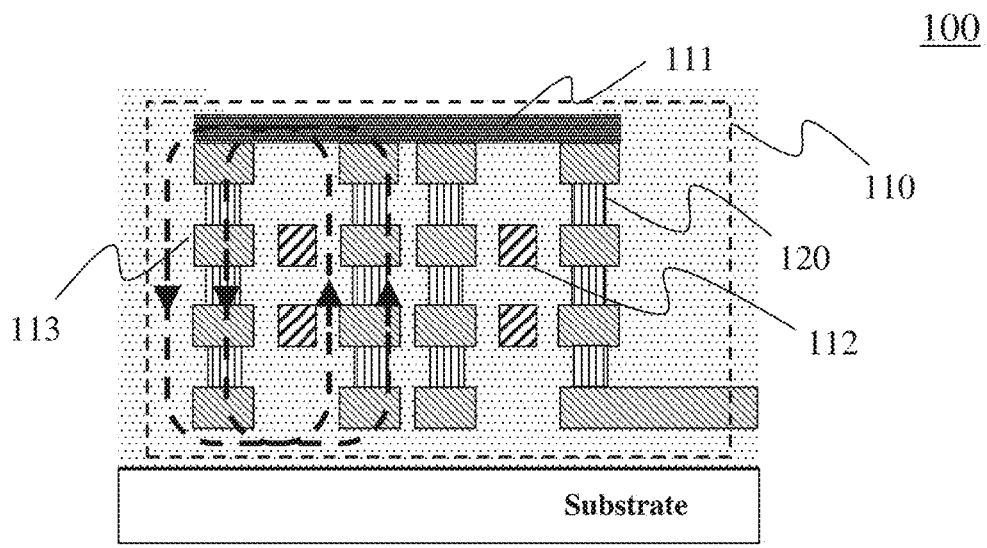
FIG. 3 is a schematic drawing illustrating a longitudinal section of a connection structure according to an embodiment.

FIG. 3 illustrates a longitudinal section of a portion of an integrated circuit 100 passing through the center of the connection structure 110 according to an embodiment. The structure 110 includes a connection terminal 111 that can be formed with a mechanically hard and electrically conductive material. In some applications one may use, for the connection terminal 111, a material that also has magnetic properties, like for example nickel, cobalt, alloys thereof or materials having mechanical and magnetic properties similar to those of the materials listed above. In this way the connection pad 110 has a good resistance to mechanical stresses and is also able to partially guide the force lines of the magnetic field produced by the inductive element 112. The connection terminal 111 could be formed so as to extend, at least partially, in one or more gaps of the discontinuous layer of metal 113 of the sub-structures 117.

The choice of magnetic materials for the connection terminal is also made based on the frequency or frequency band at which the integrated circuit will work so that the connection structure 110 has magnetic properties suitable for the use of the integrated circuit 100.

Indeed, as known there are many types of magnetic materials, which show magnetic properties in certain frequency bands, whereas in other bands they do not show magnetic characteristics. For example, a material like CoZrTa has a good magnetic permeability up to about 1.4 GHz, but at higher frequencies the magnetic permeability falls away very quickly, and the same thing occurs with NiFe at around 600 MHz.

As an alternative to using magnetic materials for the connection terminal 111, one may use a purely conductive material in which elements of magnetic material are incorporated, like for example magnetic particles and the like.

The integrated circuit 100 of FIG. 3 includes a plurality of metallization layers where the connection terminal 111 occupies the upper metallization layer, whereas the lower metallization layers are occupied by a plurality of discontinuous layers of metal 113 possibly coupled together by through holes or vertical interconnect accesses 120 (vias).

The different metal layers 113, the interconnect vias 120, and the discontinuities of the metal layer are covered by an insulating material. The gaps of the discontinuous metal layers 113 can be of various shapes and sizes as long as they are such as to ensure the correct operation of the connection structure 110 during the operation of the integrated circuit 100, also in accordance with the operating frequencies of the inductive element 112 and the parasitic phenomena of the structure, for example capacitive effects. For example, by making the connection terminal 111 with a mechanically hard material, the upper part of the connection structure 110 is strengthened and the size of the sub-structures 117 can be reduced, thus increasing the size of the gaps of the discontinuous metal layers 113 and reducing the parasitic effects. Moreover, by increasing the thickness of the upper metallization layer of the connection terminal 111, the connection structure 110 is mechanically stronger.

The integrated circuit of FIG. 3 shows a possible embodiment of the inductive element 112. In particular, the inductive element 112 can include at least one coil and thus can include a plurality of coils, each of which extends in the metallization layer on which a discontinuous layer of metal 113 is located and is positioned in the gaps between two sub-structures 117 of a discontinuous layer of metal 113. Moreover, the coil could extend over two or more metallization layers. In this way, the coil 112 is surrounded and includes one or more sub-structures 117 of the discontinuous layers of metal inside of it. In an alternative embodiment, the connection structure 110 could be designed so that the coil 112 completely surrounds one or more discontinuous layers of metal 113 arranged over one or more metallization layers.

Since the connection terminal 111 is in contact with discontinuous metallic sub-structures, the currents induced by the magnetic field produced by the coil 112 will not find a closed electric circuit through which to run and will thus be interrupted, preventing the operation of the coil 112 from being disturbed.

As well as having conductive properties, the discontinuous layers of metal 113 can also have magnetic properties so as to form paths inside the connection structure 110 suitable for guiding the magnetic field produced by the coil 112.

The inductor 112 and the connection pad 111 of the connection structure 110 can be coupled to other circuits inside the integrated circuit and can also be electrically coupled to one another. Finally, at least one discontinuous layer of metal 113 of a metallization layer of the integrated circuit 100 can extend from at least one side of the connection structure outside of it. Such a metal layer 113 can be used to couple the terminal 111 to other circuit structures integrated in the chip 100. Alternatively, such a portion of the inner metal layer 113 can be used to couple the connection terminal 111 to the earth potential.

In a variant, there can be magnetic particles in the insulating material that electrically insulates the sub-structures 117 and the inductor 112. In a further variant there can be magnetic particles in the sub-structures 117.

Figure 4:
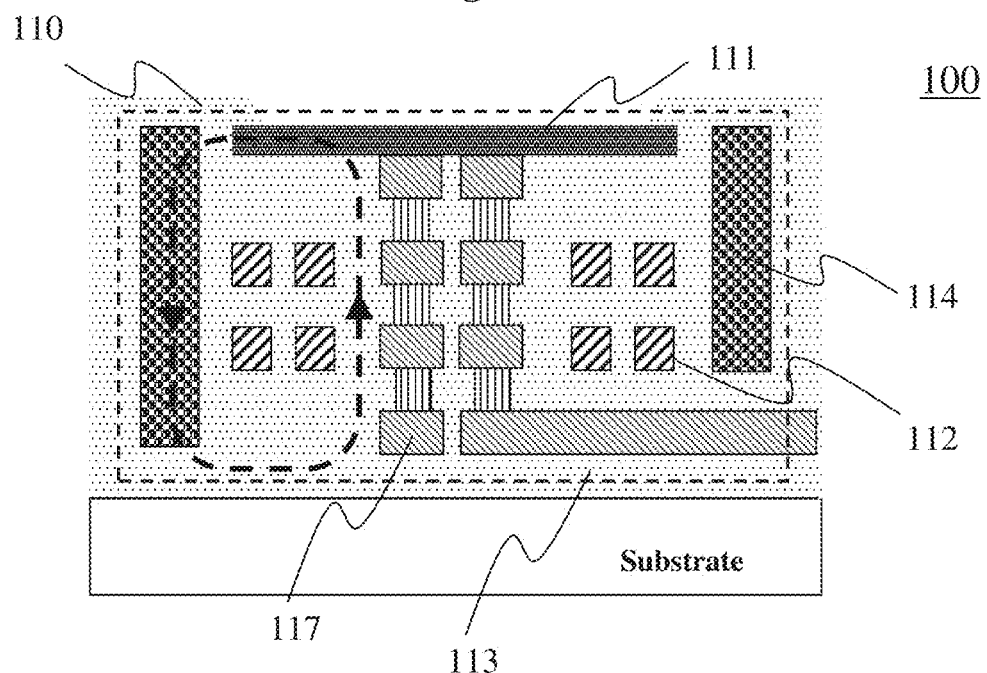
FIG. 4 is a schematic drawing illustrating a longitudinal section of a connection structure according to a further embodiment.

FIG. 4 is a longitudinal section of a portion of the integrated circuit 100 that shows an alternative configuration of the connection structure 110 according to an embodiment. The elements of the structure of FIG. 4 already described with reference to FIG. 3 will not be described any further and it should be understood that based on the particular requirements it is possible to combine elements of the structure of FIG. 3 with elements of the structure of FIG. 4. In the structure of FIG. 4, the discontinuous layers of metal 113 extend only partially in the metallization layers under the connection terminal 111. In particular, the discontinuous layers of metal 113 are positioned at the center of the connection terminal 111 and are surrounded by the inductive element 112. Positioning the discontinuous layers of metal at the center of the connection pad 111 contributes to increasing the resistance of the connection structure 110 to mechanical stress. In this embodiment the inductive element 112 is arranged on two metallization layers and on each metallization layer includes two concentric coils to form an inductor. Moreover, in order to limit the lateral electromagnetic field of the inductor and thus prevent it from interfering with other circuits during its operation, the connection structure 110 includes a containment structure 114 suitable for containing the magnetic field of the inductive element 112. Such a containment structure can be formed from materials with magnetic or conductive characteristics or both and is arranged so as to at least partially surround at least the inductor 112. The containment structure 114 for the magnetic or electromagnetic field can be formed, by creating, through a masking and etching process, a trench in the connection structure 110 and then filling such a trench with a filler material. Such a filler material can be a magnetic or conductive material or both. Moreover, the trench can be filled with an insulating material to which particles of magnetic material can be added. As is clear from FIG. 4, the trench and therefore the containment structure 114 is interrupted in a section corresponding to the metallization layer that allows the inner discontinuous layer of metal 113 to extend outside of the connection structure 110 so as to create a connection between the connection structure 110 and, therefore, the connection terminal 111, and the inductive element 112 and other circuits outside of the connection structure 110.

Although in the embodiment illustrated in FIG. 4 the containment structure 114 is interrupted in just one section, it should be understood that such a structure can be interrupted in many points and over many metallization layers so as to couple many circuit elements belonging to the connection structure 110 with integrated circuits outside of such a structure.

Moreover, the trench can also be filled with a filler material having only insulating characteristics, like for example an oxide. Alternatively for the filler material it is possible to choose an oxide with magnetic characteristics so as to obtain a non-conductive magnetic containment structure or else metals like nickel, cobalt, their alloys or similar materials to obtain a confinement structure 114 with conductive and magnetic characteristics.

In the case in which the containment structure is formed from a conductive material, such a structure can be interrupted so as to have gaps that avoid the formation of eddy currents.

Figure 5:
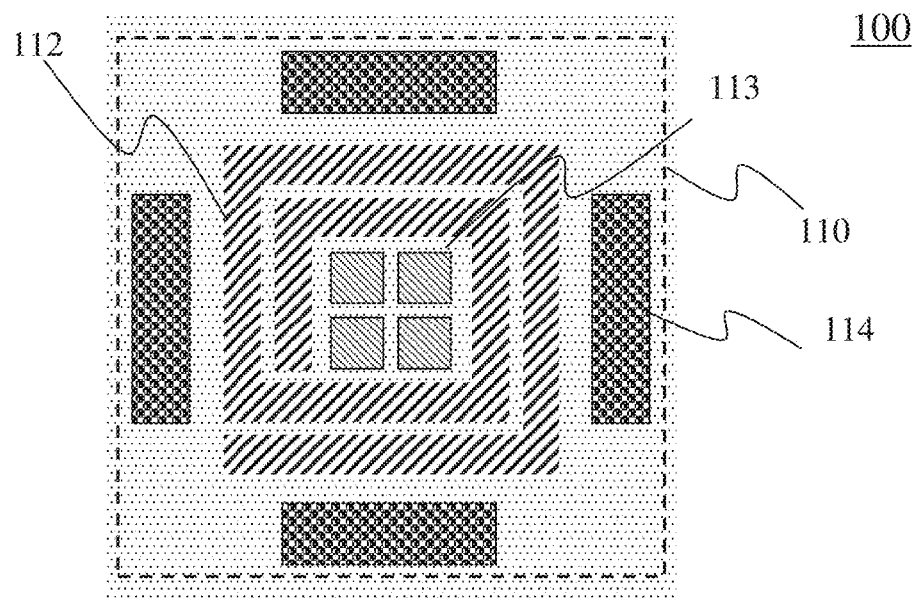
FIG. 5 is a schematic drawing illustrating a cross section of the connection structure of FIG. 4 according to an embodiment.

FIG. 5 shows a cross section of the connection structure 110 of FIG. 4 according to an embodiment. The containment structure 114 includes 4 containment elements 114 positioned at the sides of the coil 112. Moreover, from this figure it is possible to see how the inductive element 112 is shaped like a coil.

Although the embodiment illustrated in FIG. 5 shows a connection structure formed from 4 distinct containment elements 114, such a structure could also be made in the form of a loop so as to completely surround the coil 112. Alternatively, any other shape that adapts to the particular structure of the inductive element 112 and of the connection structure 110 can be used.

Figure 6:
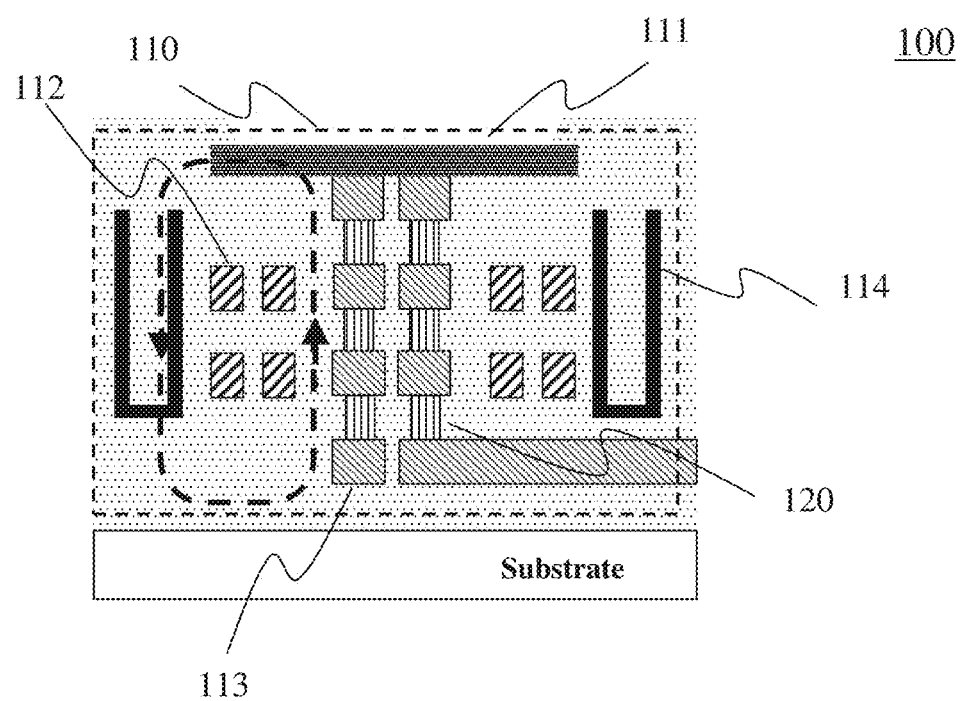
FIGS. 6 to 8 are schematic drawings that illustrate a longitudinal section of a connection structure according to different alternative embodiments.

A variant of the embodiment illustrated in FIG. 5 is illustrated in FIG. 6. The containment structure 114 is formed by depositing a layer of magnetic material in the trench formed around the inductive element 112.

The trench can alternatively be filled with a material having different characteristics from the layer of magnetic material previously deposited in the trench. For example, the trench could be filled with an insulating material. In this way, the occurrence of eddy currents can be eliminated, which otherwise, using a magnetic metal, could be induced by the magnetic field generated by the inductive element 112.

Figure 7:
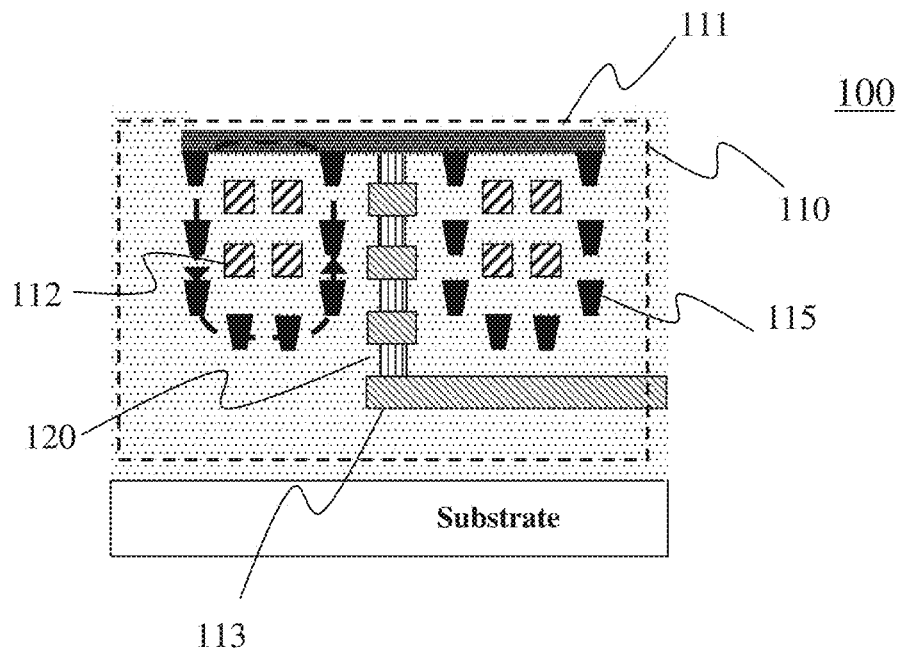

FIG. 7 illustrates a subsequent embodiment where the inductor 112 is at least partially surrounded by elementary containment structures 115 having magnetic and conductive characteristics. Such structures could, for example, be vertical interconnect accesses (or vias) or through holes coated with magnetic material.

In the case in which the inductor is a coil 112, the elementary containment structures 115 can be arranged over different levels and arranged inside and outside the coil 112 so as to form a cage around the coil 112. The containment elements 115 situated under the connection terminal 111 can be coupled to it. The configuration described with reference to FIG. 7 contributes to confining the force lines of the magnetic field inside the inductor and outside of it, thus contributing to shielding the inductor and consequently improving its performance.

Figure 8:
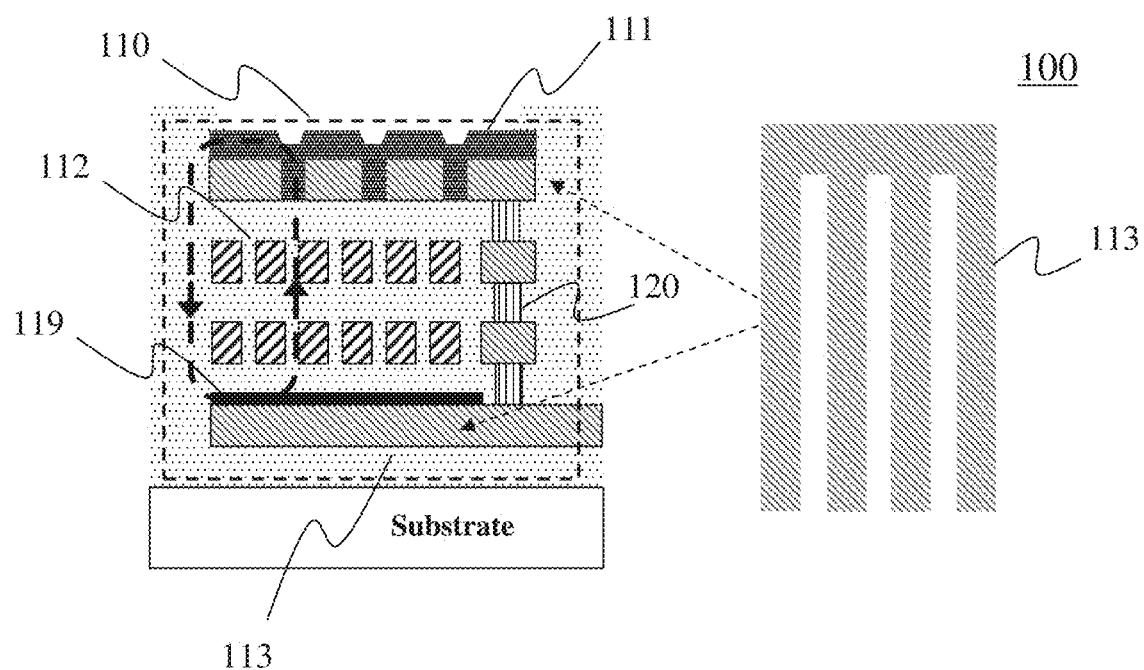

FIG. 8 shows a longitudinal section of a connection structure 110 according to a further embodiment. The connection terminal 111 is formed using hard materials. Moreover, the first metallization layer under the connection terminal 111, just like the metallization layer, can be made using interdigitated structures to reduce the occurrence of eddy currents. The interdigitated structure used in the embodiment of FIG. 8 is shown in the detail of FIG. 8. The connection terminal 111 can be created by growing, for example through an electroless process, a layer of hard material having magnetic and conductive characteristics so that it can also fill the gaps of the interdigitated structure. In order to reduce the occurrence of eddy currents, the hard material used for the connection terminal 111 can be chosen so as to have a greater resistivity than the interdigitated structure below. A material having the characteristics indicated above is, for example, nickel. In addition, a layer of magnetic material 119 can be deposited on the surface of the metal layer 113 in the lower metallization layer facing towards the inductor 112. This embodiment makes it possible to confine and guide the magnetic field of the inductor 112 and improve its performance.

Since in the embodiment of FIG. 8 the connection terminal 111 is formed from a mechanically hard material, it is not necessary to form a vertical structure made up of metal layers and vias at the center of the connection structure 110. Therefore, such a vertical structure can be made at the edges of the connection structure 110, thus increasing the space inside such a structure 110 that can then be used to make circuit structures, like an inductor, with complex shapes and of larger sizes.

FIGS. 9 to 13 illustrate a process for creating a connection structure 110 according to an embodiment. In this embodiment, the connection pads 110 have a magnetic structure 150 (shown in FIG. 13) inside the inductor 112. In order to obtain this structure, in a first step of the manufacturing process a trench is created inside the coils of the inductor 112 through a masking and etching process until a layer of metal 113 is reached in the last metallization layer of the integrated circuit 100. The trench 116 can be circle or square shaped or alternatively have any other cross section based on the requirements and the design of the connection structure. This step of the manufacturing process is illustrated in FIG. 9.

Figure 12:
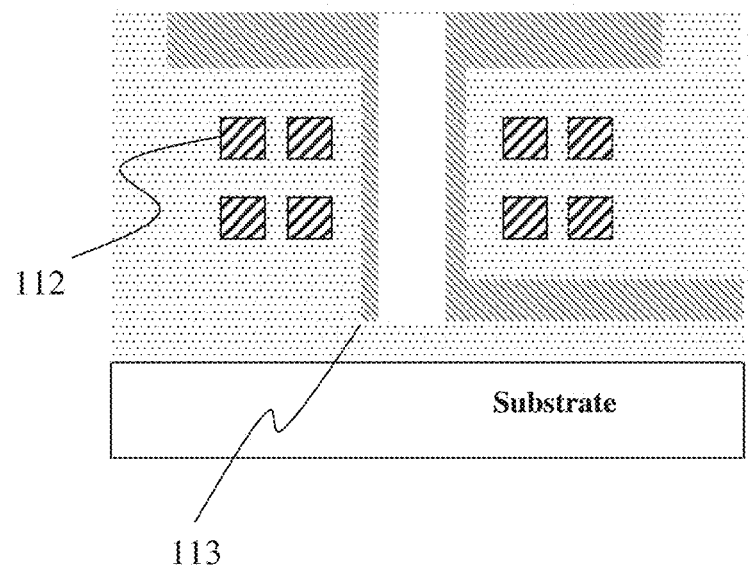

FIG. 10 illustrates a second manufacturing step in which the trench 116 is filled with a conductive material like, for example, copper or aluminum. In the case in which copper is used as conductive material, a seed is deposited in the trench 116 to grow it and, thereafter, a CMP (Chemical Mechanical Planarization) operation is carried out to remove the excess material on the surface. The conductive structure inside the inductor can be introduced so as to form gaps to prevent eddy currents from forming (not shown in the figures). In a subsequent manufacturing step, illustrated in FIG. 11 an upper metal layer is created, through a masking and deposition process, and then, as illustrated in FIG. 12, the insulating material inside the conductive structure inside the inductive element 112 is removed.

Figure 13:
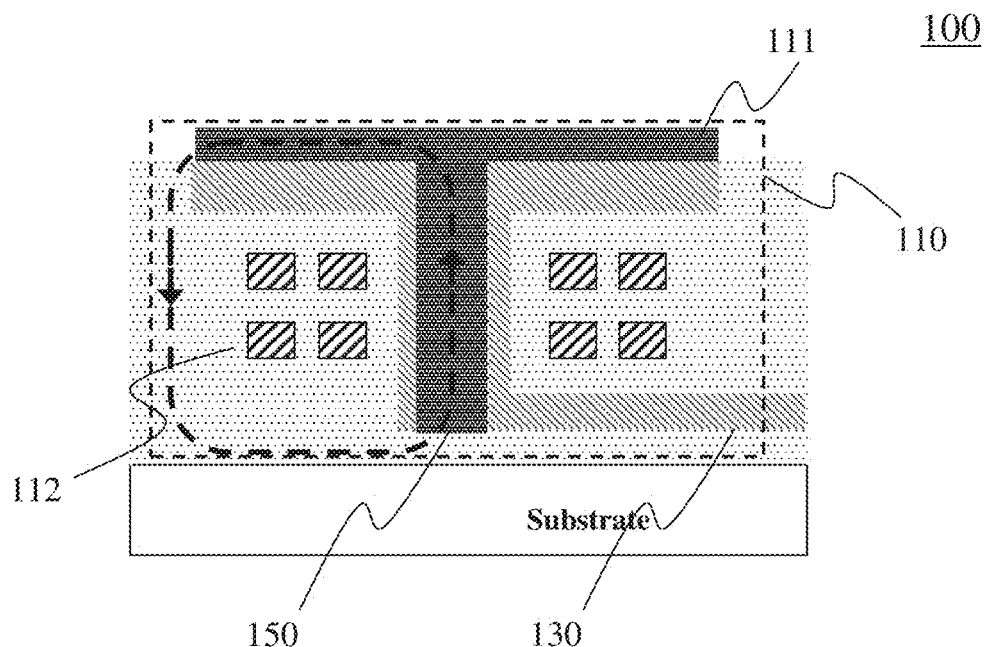

Finally, in a last manufacturing step described in FIG. 13, a mechanically hard, electrically conductive material with magnetic properties like, for example, nickel, cobalt or their alloys or materials with similar characteristics, is deposited inside the conductive structure. Such a step can be carried out using an electroless process or other known processes that can be used for the purpose.

Figure 14:
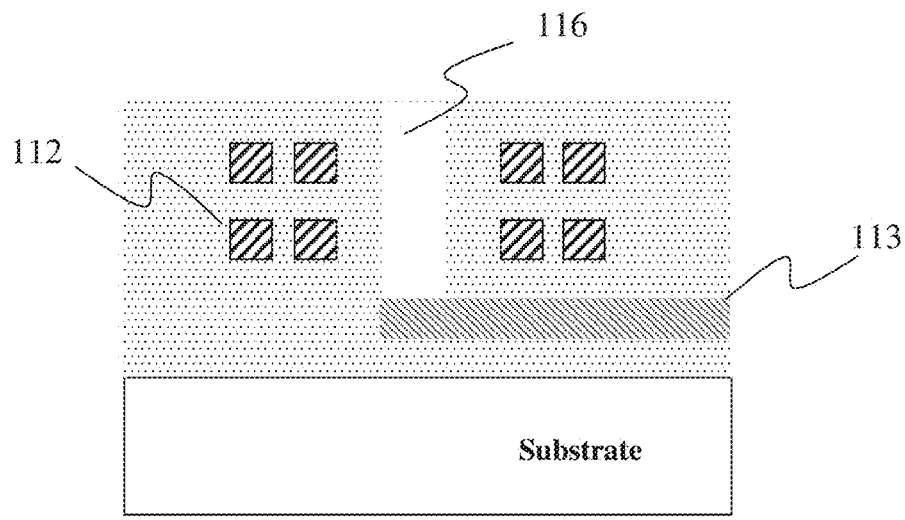
FIGS. 14 and 15 are schematic drawings illustrating a process for manufacturing a connection structure for an integrated circuit according to an alternative embodiment.
Figure 15:
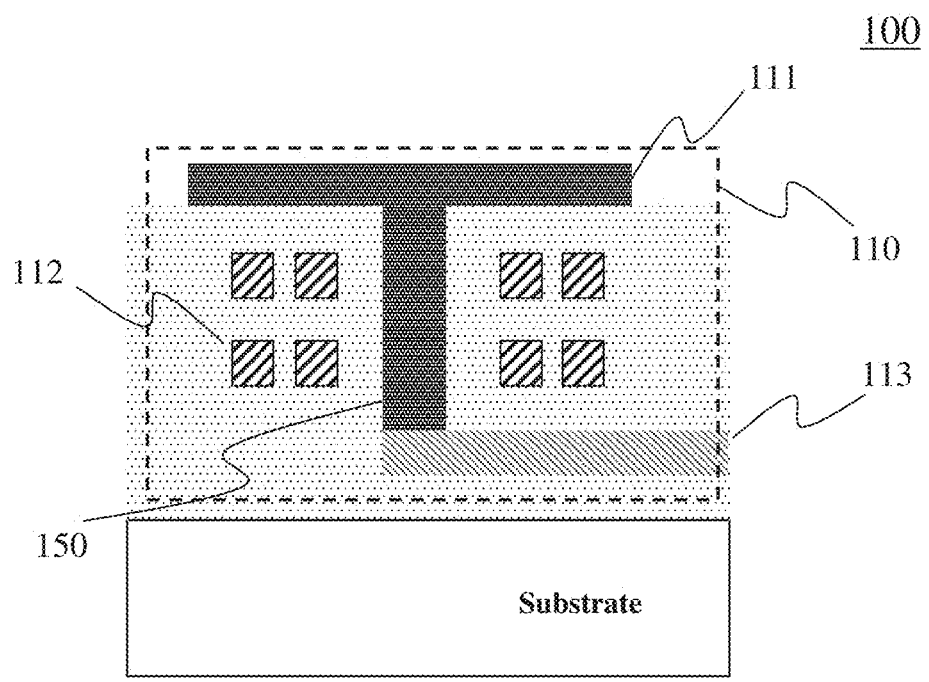

FIGS. 14 and 15 show an alternative manufacturing process in which the structure inside the inductor 112 is formed by creating a hole 116 through a masking and etching process inside the inductor. This step is described in an illustrative manner in FIG. 14.

In a subsequent manufacturing step, schematically illustrated in FIG. 15, the through hole 116 is filled with a magnetic element 115 of mechanically hard, electrically conductive material with magnetic properties, like, for example, nickel, cobalt and the like. Such a magnetic element 150 that fills the via 116 will be used to form the surface of the connection terminal 111.

As an alternative to materials like nickel and the like, the via 116 can be filled with a filler material containing particles of magnetic or conductive material or both. Alternatively, the filler material can have insulating characteristics together with magnetic characteristics, like, for example, an oxide with magnetic characteristics. Alternatively, the filler material can be a conductive polymer.

Figure 16:
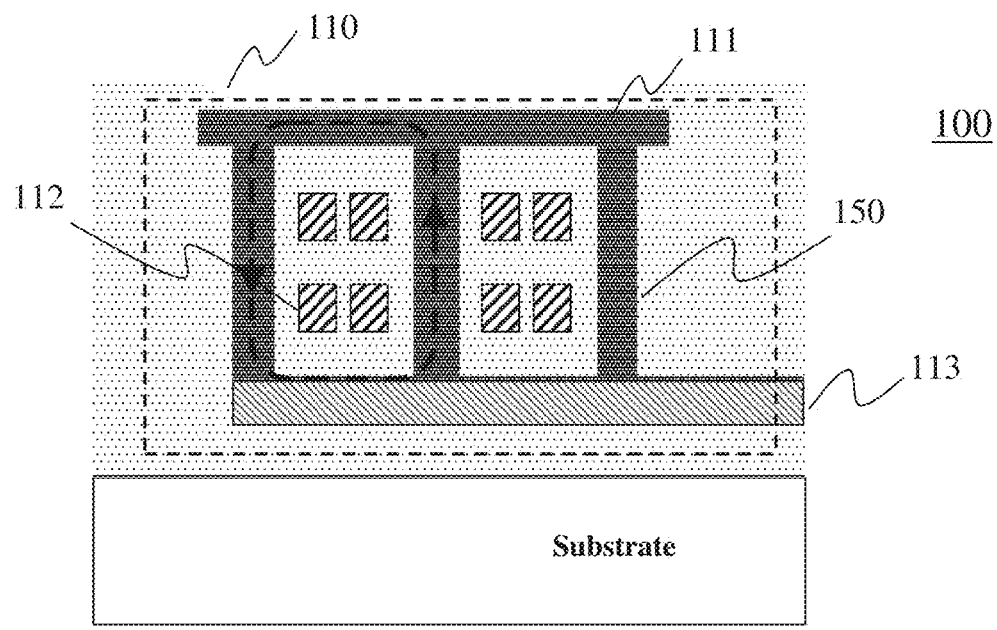
FIG. 16 is a schematic drawing illustrating a longitudinal section of a connection structure for an integrated circuit according to a further embodiment.

FIG. 16 is a schematic drawing illustrating a longitudinal section of a connection structure 110 according to a further embodiment. The embodiment of FIG. 15 is based on the structure described in FIG. 14. In addition to the structure of FIG. 14, the connection structure in FIG. 15 includes a magnetic structure 150 both inside and outside the inductor 112. Moreover, a layer of magnetic material is deposited on the surface of the metal layer located in the lowest metallization layer facing towards the inductor 112. This structure contributes to completely shielding the inductor 112. Moreover, the lines of the magnetic field will tend to concentrate in the magnetic structures 150, thus guiding the force lines of the magnetic field and thus optimizing the performance of the inductor 112.

Figure 17:
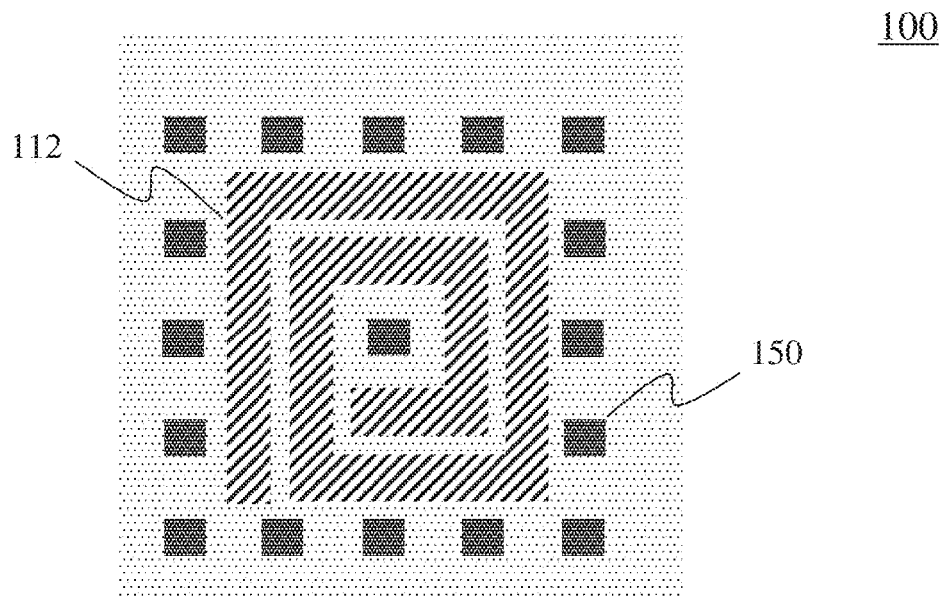
FIG. 17 is a schematic drawing illustrating a cross section of the connection structure of FIG. 16 according to an embodiment.

FIG. 17 shows a cross section of the connection structure 110 of FIG. 15 obtained by cutting the semi-conductor on the plane between the two coils of the inductor 112 belonging to two overlapping metallization layers.

Figure 18:
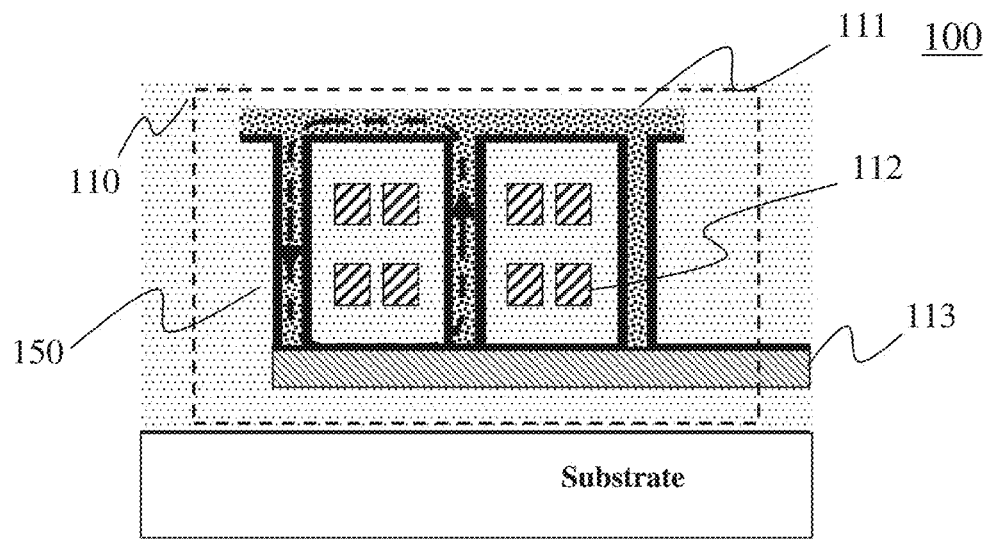
FIGS. 18 and 19 are schematic drawings illustrating a longitudinal section of a connection structure according to two further alternative embodiments.

FIG. 18 shows a variant of the connection structure 110 of FIG. 16. This embodiment is similar to the embodiment of FIG. 16 with the exception that the magnetic material 150 is deposited in the through holes 116 that are then filled further with a different material from the material used for the magnetic structure 150. Such a material can be conductive with a different resistivity from that of the magnetic material of the structure 150 and can be used to form the connection terminal 111. The material that forms the connection terminal 111 can be deposited directly into the holes 116 or else it can be deposited through an electroless process or other. The material of the connection terminal 111 can be a material with magnetic characteristics.

Figure 19:
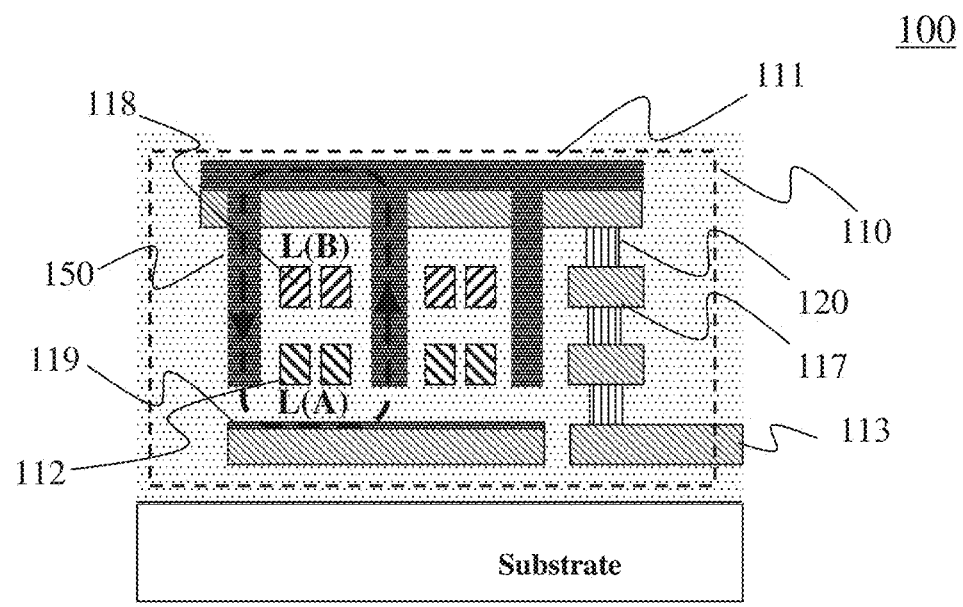

FIG. 19 shows a longitudinal section of a connection structure including a first inductor 112 and a second inductor 118. Moreover, the connection structure 110 includes a first discontinuous layer of metal 113 in the metallization layer under the connection terminal 111. Such a discontinuous layer of metal can be an interdigitated structure. The first discontinuous layer of metal is coupled with a further discontinuous layer of metal arranged in the lower metallization layer of the integrated circuit. The two discontinuous layers of metal 113 are coupled through a sub-structure 117. The material forming the connection terminal 111 is deposited on the first discontinuous layer of metal 113 so as to fill the gaps of the discontinuous layer of metal 113 and to form a containment structure 150 inside and outside the coils of the inductors 112 and 118.

In order to improve the performance of the containment structure 150 for the inductors 112 and 118, a layer of magnetic material 119 can be formed on the surface of the metal layer 113 in the lower metallization layer of the integrated circuit 100 facing towards the inductors 112 and 118. The structure of FIG. 19 having two inductors can be used with the function of a transformer.

Although the previous embodiments have been described independently from one another, each of the structures described can be varied so as to use different inductive elements, containment structures, and sub-structures from those described. Moreover, the structures described in each of the various embodiments can be used interchangeably in the connection structures relative to the other embodiments.

FIGS. 20 to 23 illustrate possible uses of the connection structure 110 according to an embodiment and, in particular, an integrated circuit 100 including at least one connection structure according an embodiment.

Figure 20:
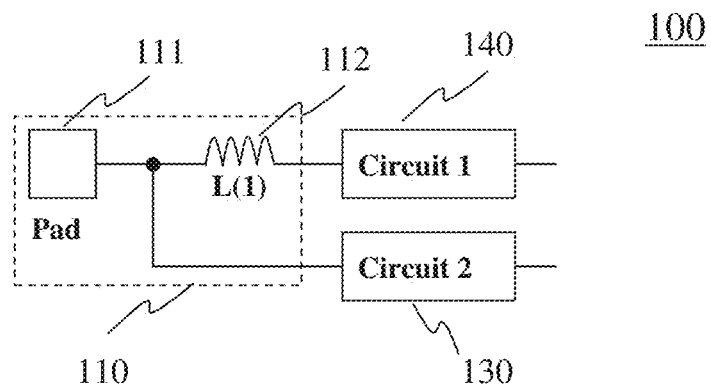
FIGS. 20 to 23 are diagrams illustrating circuits including a connection structure according to alternative embodiments.

In the integrated circuit 100 of FIG. 20, one end of the inductor 112 is coupled to the connection terminal 111, whereas the remaining end is coupled to a circuit 140. Simultaneously, the connection terminal 111 can be coupled directly to a second circuit 130. In this example, the inductor 112 can, for example, have the function of a filter or be part of a more complex filter to eliminate disturbance in the power supply of the circuit 140. The system of FIG. 20 can also be used, for example, for a communication interface through a power line in which the circuit 140 represents the circuit fed through the power line, while the circuit 130 is a transceiver system.

Figure 21:
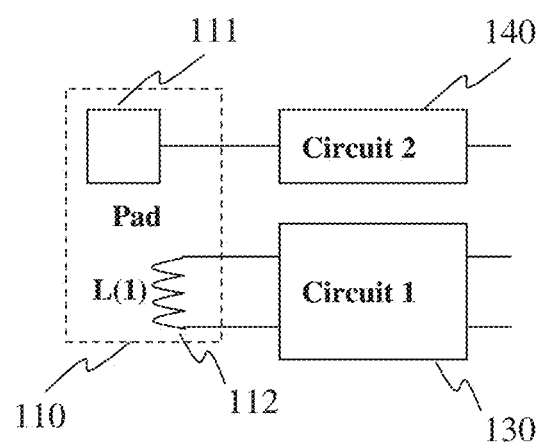

FIG. 21 is a schematic diagram that illustrates an integrated circuit 100 in which the inductor 112 is not coupled to the connection terminal. In this case the inductor 112 can be part of a communication circuit that uses electromagnetic waves. For example, in the integrated circuit 100 of FIG. 21 the circuit 130 represents a transceiver system whereas the circuit 140 is a circuit that receives an electrical or electronic signal or else a power supply signal through the connection terminal 111. The inductor 112 can also be used, for example, to transmit or receive power from and towards circuits outside of the integrated circuit 100. Furthermore, the inductor 112 can, for example, be part of a transformer, where the other inductor may or may not belong to another LPAD and such an inductor can be present in the same integrated circuit 100 or in another integrated circuit, or more generally it may belong to a system outside of the integrated circuit 100. Moreover, in the case in which the integrated circuit 100 includes a plurality of connection structures 110, the inductors 112 of these structures could be coupled to one another to make inductors of greater size and power.

Figure 22:
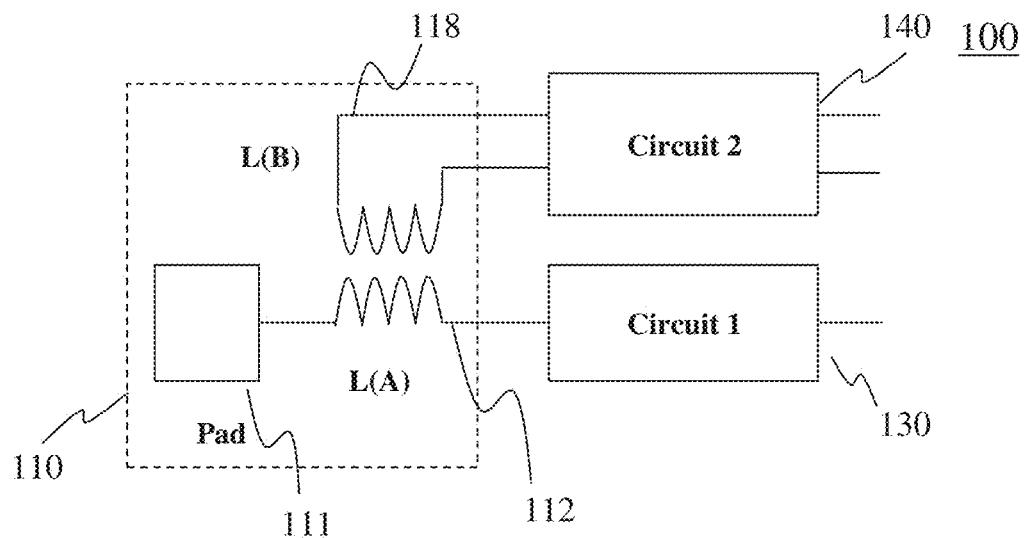

FIG. 22 shows an integrated circuit 100 in which the connection structure includes two inductors so as to form part of a transformer. The integrated circuit 100 of FIG. 22 can be used, for example, in switching power circuits in which the circuit 130 varies the current in the inductor 112 and the circuit 140 takes care of rectifying and stabilizing the current coming from the inductor 118. This system can also be used, for example, to receive the energy due to the variation of the current that feeds the circuit 130, for example, following disturbances that can even be impulsive. Finally, this system can also be used, for example, as a communication interface through a power line in which the circuit 130 is fed from an external source through the connection terminal 111, whereas the circuit 140 is a transceiver that communicates with circuits outside the integrated circuit through the inductors 118 and 112.

Figure 23:
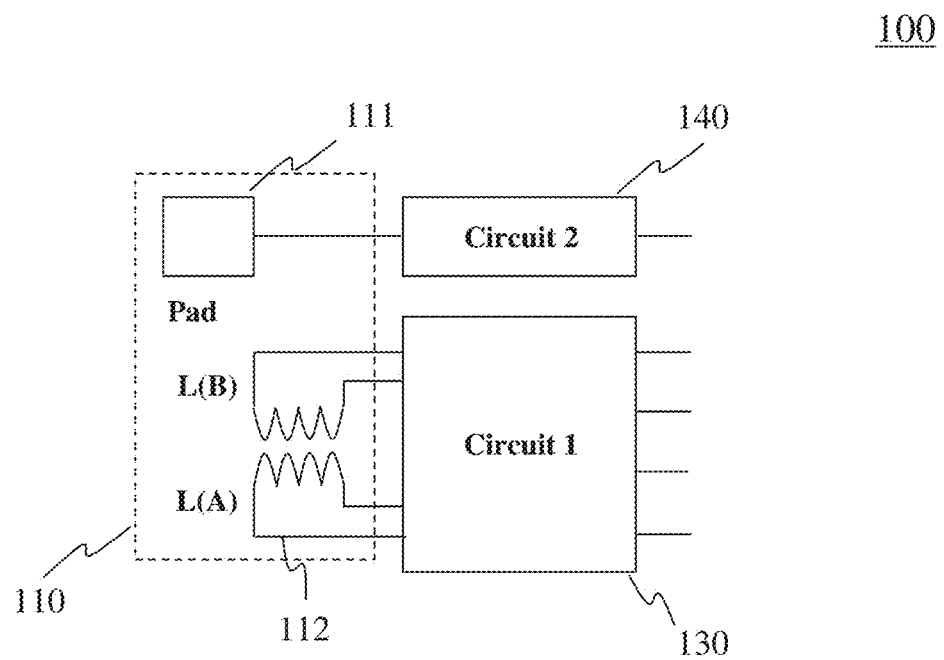

FIG. 23 shows a circuit diagram including a first inductor 112 and a second inductor 118 coupled to a first circuit 130. The circuit 130 uses the transformer formed by the inductors 112 and 118 whereas the circuit 140, directly coupled to the connection terminal 111, will receive or send an electrical signal through the connection terminal 111.

Figure 24:
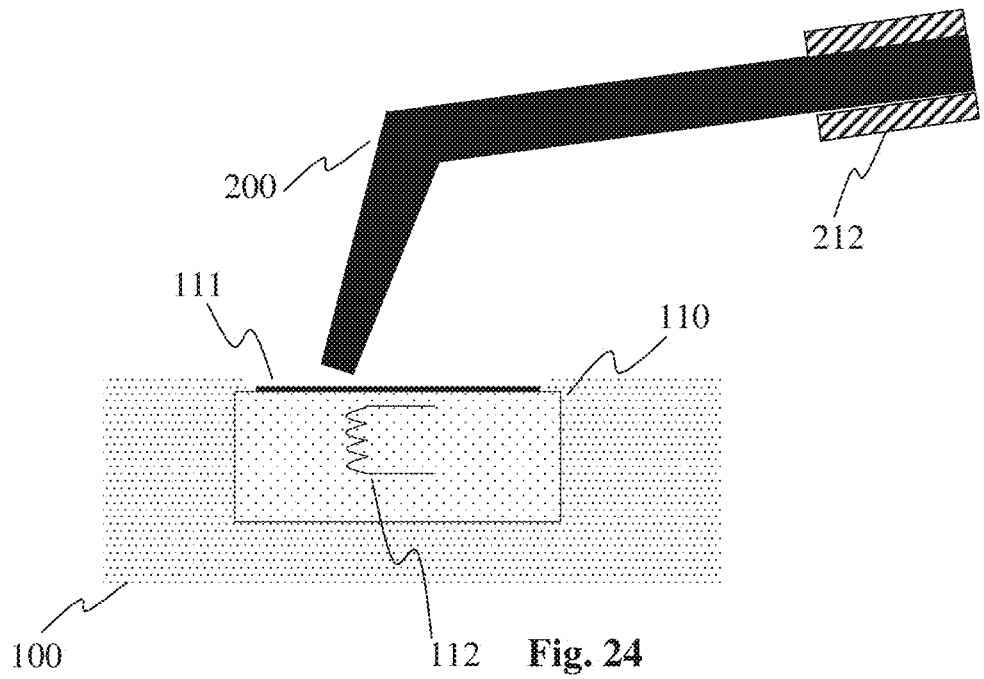
FIGS. 24 and 25 are schematic drawings illustrating a system including a probe and a connection structure according to further embodiments.

FIG. 24 illustrates a system that can be used for electrical and/or electromagnetic testing of a connection structure 110 according to an embodiment and of the circuits coupled to it. The system includes a probe 200 forming part of a probe card (not shown in the figures). The probe can be of the cantilever, vertical, or MEMS (MicroElectroMechanical Systems) type or similar and it is coupled with an inductor 212. The probe can be built with materials having conductive characteristics, like, for example, copper, tungsten, or magnetic characteristics like, for example, nickel, cobalt or their alloys, or both. In a variant, the probe 216 can be built with a conductive material, like, for example, copper, and then coated with materials 214 with magnetic characteristics, like, for example, nickel or cobalt, their alloys and similar materials. In a further variant, the probe 200 can be built with a conductive material containing magnetic particles. This embodiment is illustrated in FIG. 25.

Figure 25:
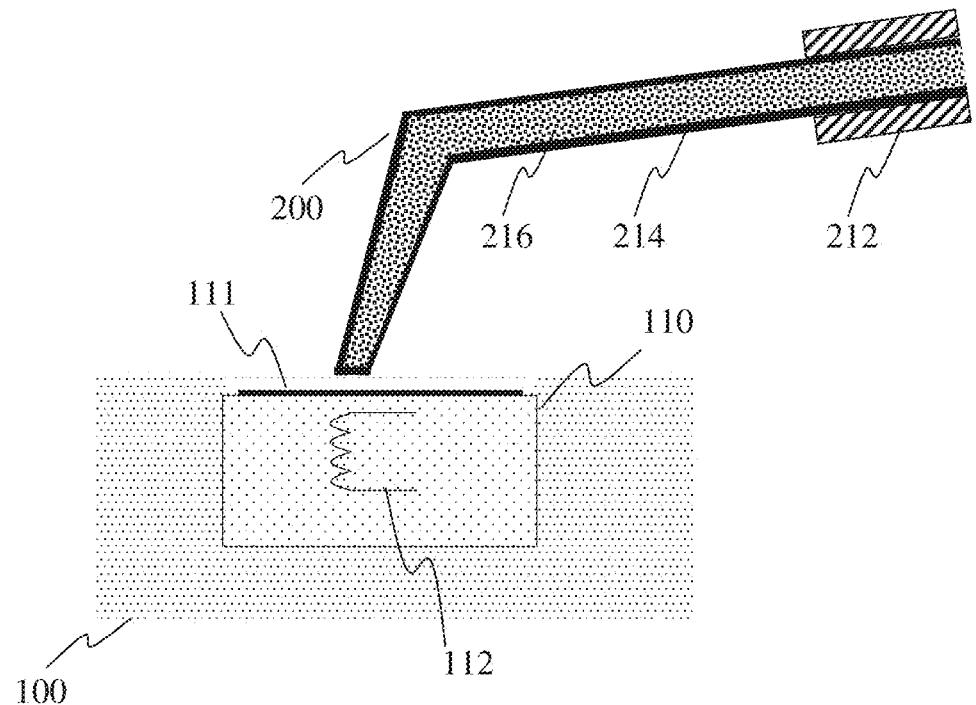

In the system of FIGS. 24 and 25, if the probe is in contact with the connection structure 110, there can be a current that flows from the probe 200 towards the pad 110 or vice-versa. Moreover, through the probe 200 a magnetic flux forms between the inductors 112 and 212. Therefore, with a single probe 200 at least part of an integrated circuit 100 can be fed through the magnetic field and at the same time information can be exchanged with the chip 100 through electrical signals through the contact between the probe 200 and the connection terminal 111 and through the magnetic field generated between the inductors 212 and 112.

If the probe 200 is not in contact with the connection terminal there will only be magnetic flux between the inductors 212 and 112. In this case with just the probe 200 a part of the integrated circuit 100 can be fed and information can be exchanged with it through the magnetic field thus carrying out a contactless test. During the alignment step between the probe 200 and the connection terminal 111, it is also possible to measure the intensity of the magnetic field in order to obtain a correct alignment of the probe 200 with the pad 110.

Figure 26:
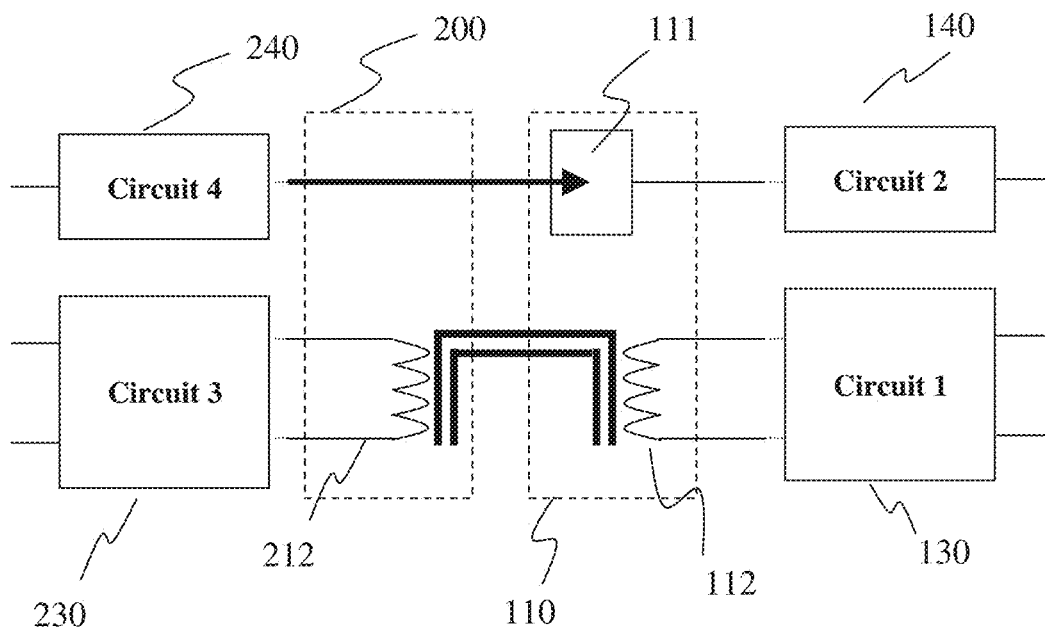
FIGS. 26 and 27 are schematic diagrams illustrating uses of a testing system according to embodiments.

FIG. 26 shows a schematic diagram in which a circuit 230 and a circuit 240 belonging to a testing apparatus (not shown) are coupled to the circuits 130 and 140 of the integrated circuit 100 through the probe 200 and the connection structure 110. The circuit 130 generates the power necessary to feed the integrated circuit 100 or part of it, whereas the circuit 140 will receive and transmit electrical signals with the testing apparatus. The circuit 230 in the testing apparatus can be one from a receiving circuit, a transmitting circuit, a power supply circuit, or a combination thereof. Correspondingly, the circuit 130 can be one from a transmitting circuit, a receiving circuit, a power supply circuit, or a combination thereof, where the combination can be selected in accordance with and so as to be compatible with the functionality of the circuit 230. The circuits 130 and 140 can also be coupled together, and/or they can be coupled to a reference potential, for example the earth/ground potential.

Figure 27:
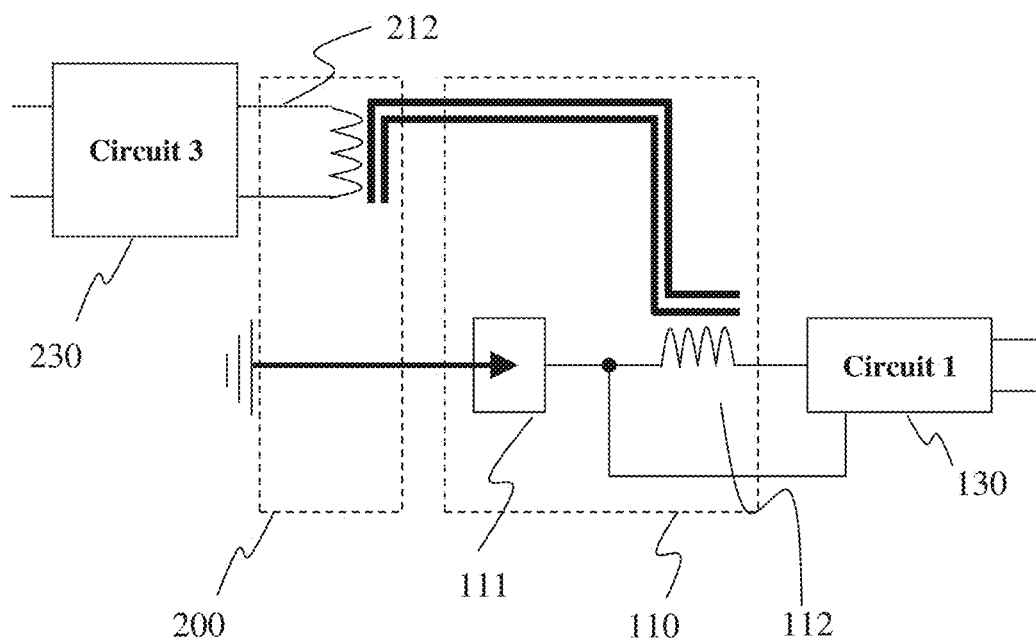

FIG. 27 shows a schematic diagram of a possible configuration of the testing system according to an embodiment. The probe 200 of a testing apparatus, like, for example, an ATE, is coupled to earth and is in contact with the connection terminal 111. The inductor 212 in the probe, or inductor probe, is coupled to a circuit 230 of the ATE that could, according to the particular type of testing system and its use, be one from a receiving circuit, a transmitting circuit, a power supply circuit, or a combination thereof. Similarly, the inductor 112 of the connection structure 110 of the integrated circuit 100 is coupled to a circuit 130 in the chip 100, which could be one from a transmitting circuit, a receiving circuit, a power supply circuit, or a combination thereof. The choice of the type of circuit 130 is made so that the circuit 130 of the chip 100 corresponds in its function and is compatible with the circuit 230 in the ATE. During the operative step of the system, there is a magnetic flux between the inductors 112 and 212 that makes it possible to feed the chip 100, or at least part of it, and exchange information with it.

Figure 28:
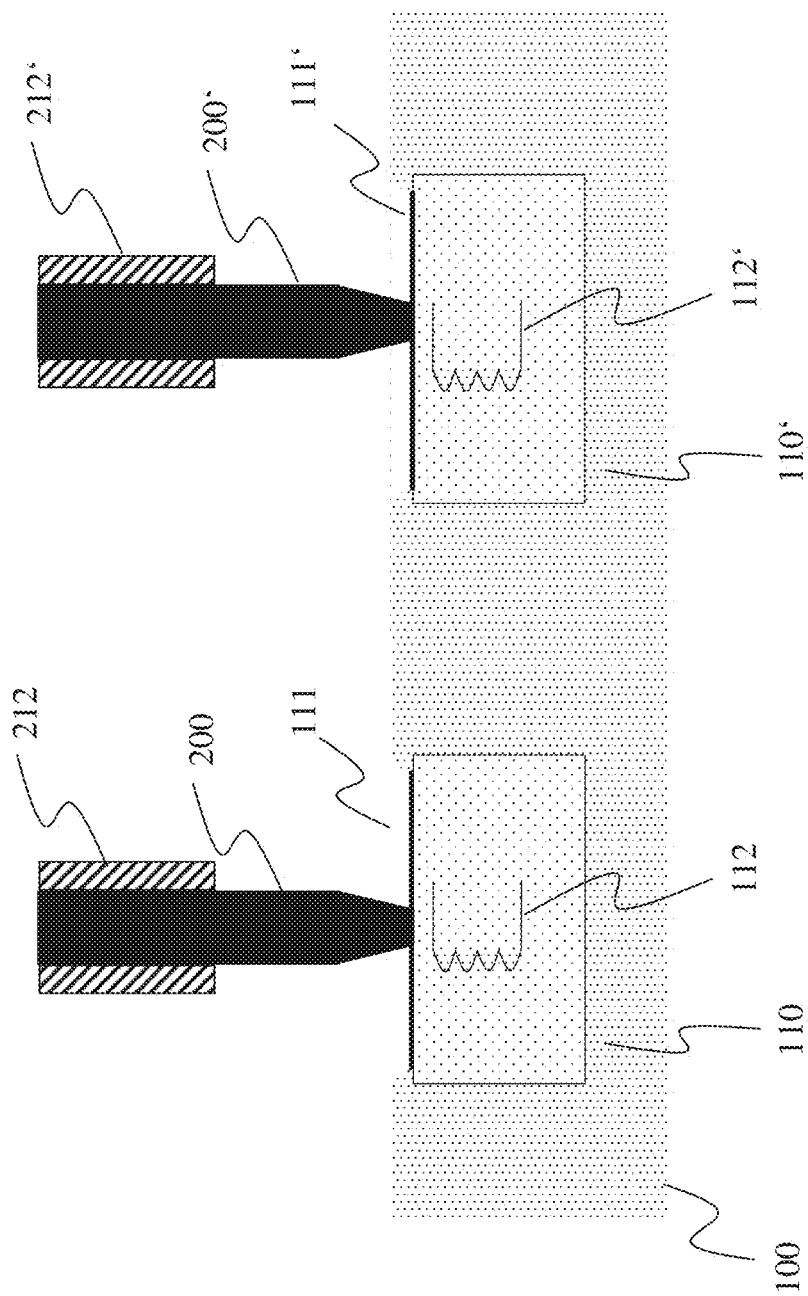
FIG. 28 is a schematic drawing illustrating a testing system including an integrated circuit with a plurality of connection structures and a plurality of test probes according to an embodiment.

FIG. 28 describes a system with two connection structures 110 and 110' coupled to two probes 200 and 200'. It is understood that this example is not limiting and a testing system could include more than two connection structures 110 according to the type of circuit 100 to be tested and the test conditions. In particular, if a single connection structure 110 or LPAD is insufficient to feed the chip 100, many LPADs 110 can be used. Such LPADs 110 can be independent from each other. Alternatively, the connection structures 110 present in the integrated circuit 100, or a group of them, can be coupled together in various ways. For example, the inductors 112 of two or more LPADs 110 can be coupled together so as to form an inductor of greater size.

Figure 29:
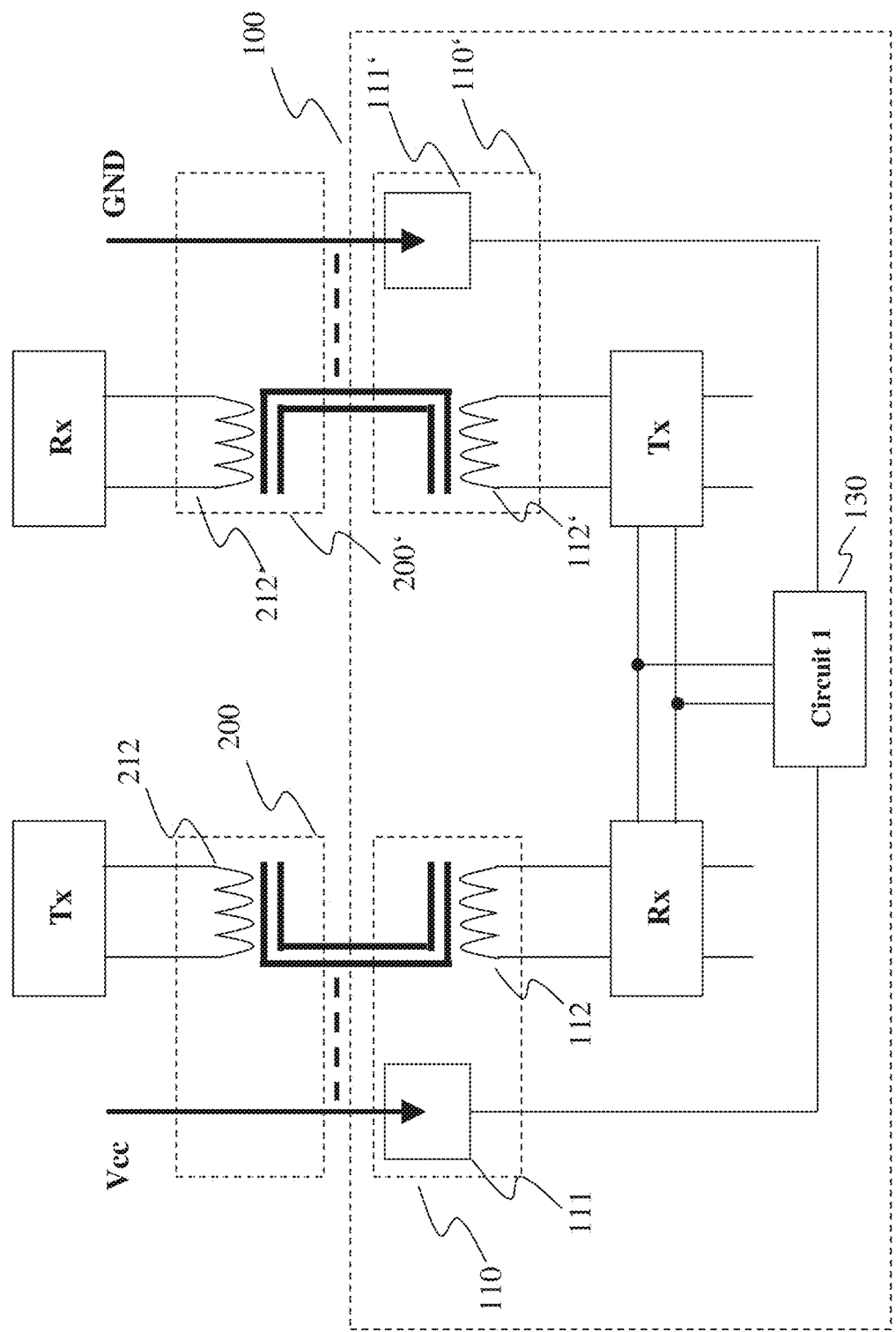
FIGS. 29 and 30 are schematic diagrams illustrating different possibilities of coupling between probe and connection structure of the system illustrated in FIG. 28 according to different embodiments.
Figure 30:
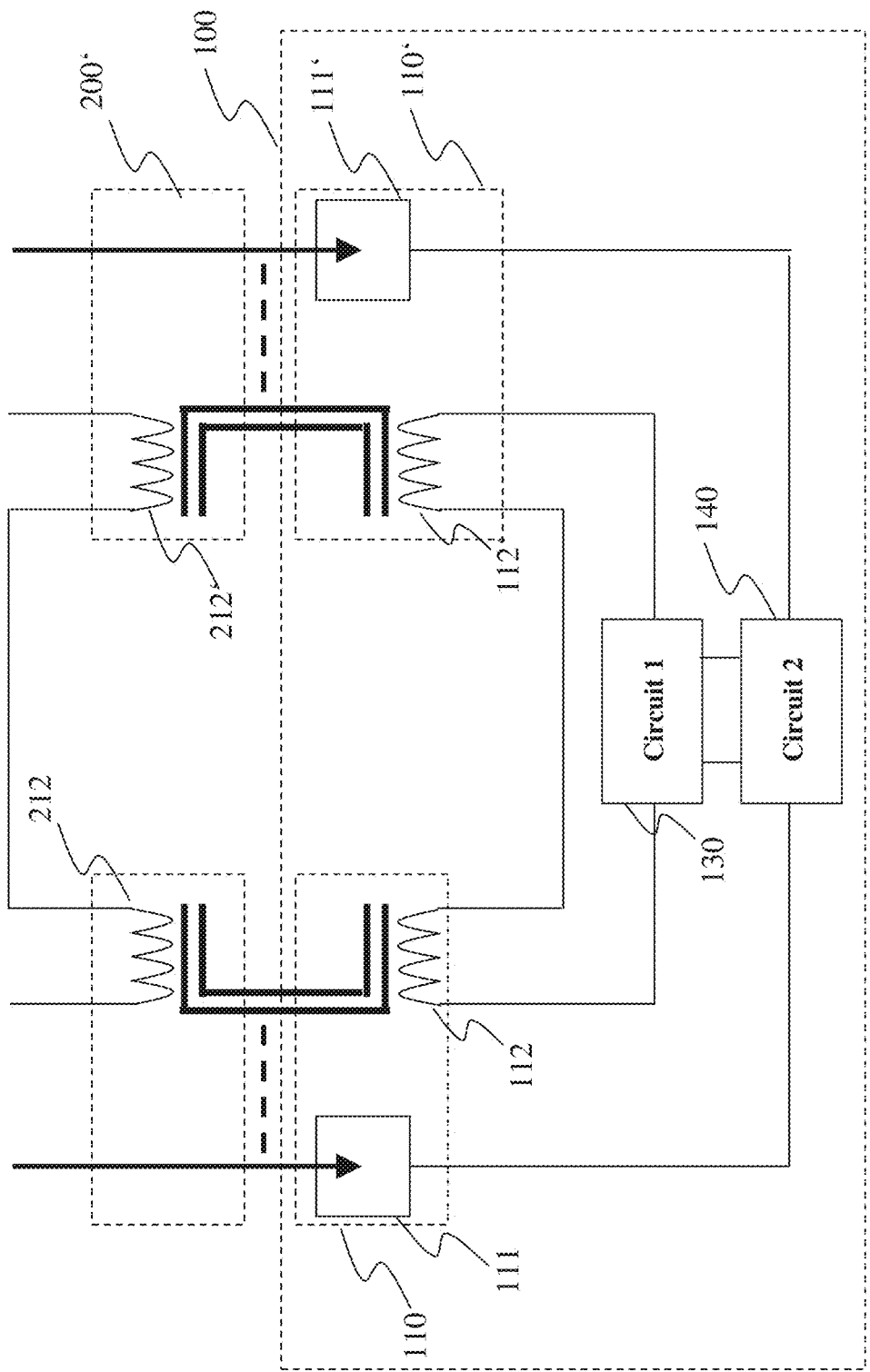

FIGS. 29 and 30 are schematic diagrams that illustrate possible connections between a testing system ATE including two probes 200 and 200' and a chip 100 including two connection structures 110 and 110'.

In the system of FIG. 29, the inductors 112 and 212 are used to transmit data from the tester ATE towards the integrated circuit 100 to be tested (DUT), whereas the inductors 112' and 212' are used to transmit data from the DUT 100 towards the tester ATE. The integrated circuit 100 is fed through the circuit 130. In particular, in the case described here, the probe 200 is coupled to a power supply potential $V_{CC}$, whereas the probe 200' is coupled to a ground reference potential (GND) and such probes will make a current I flow through the circuit 130 by making contact, respectively, with the connection terminals 111 and 111'.

Although in the example of FIG. 29 the chip 100 is fed directly through the probes 200 and 200', it is also possible to have a system in which the chip 100 is fed through the magnetic field generated by the inductors 212 and 212', and used by the inductors 112 and 112'.

In the system of FIG. 30 the inductors 212 and 212' and the inductors 112 and 112' are coupled together in series. Through the inductors 112 and 212 and the inductors 112' and 212' the ATE can supply power to the DUT 100, which will obtain power through the circuit 130. Moreover, if the probes 200 and 200' are coupled to the chip 100 through the connection terminals 111 and 111' of the LPADs 110 and 110', electrical signals can be exchanged between the tester ATE and the circuit 140. Clearly, it is possible, according to the design requirements, to couple the coils inside the ATE and inside the DUT even in a different way from that described above.

It may be useful to close to magnetic path between two LPADs 110 and 110' using, for example, a layer of material having magnetic characteristics. Such a layer of magnetic material can be arranged in a layer of integrated circuit 100, for example, below the connection structures 110 and 110', so that it extends so as to approach, and possibly at least partially enter/overlap, the connection structures 110 and 110' themselves. The LPAD 110, as well as allowing a wireless test of the devices 100 on a wafer to be carried out, also allows its "Final Test" to be performed, for the reliability on the wafer, in the jargon called WLBI (Wafer Level Burn-In), or for the failure test on the customer application (customer returns).

After the electrical and/or electromagnetic test, the various devices 100 present on the wafer are separated from one another through a cutting operation of the wafer itself through a saw or a laser, and the assembly and packaging is carried out. In particular, the integrated circuit 100 is coupled to other circuits or to a substrate through the connection terminal 111 of the connection structure 110. Such connections can be created through wire bond or else, in a "flip chip" design, they can take place using connection bumps.

Figure 31:
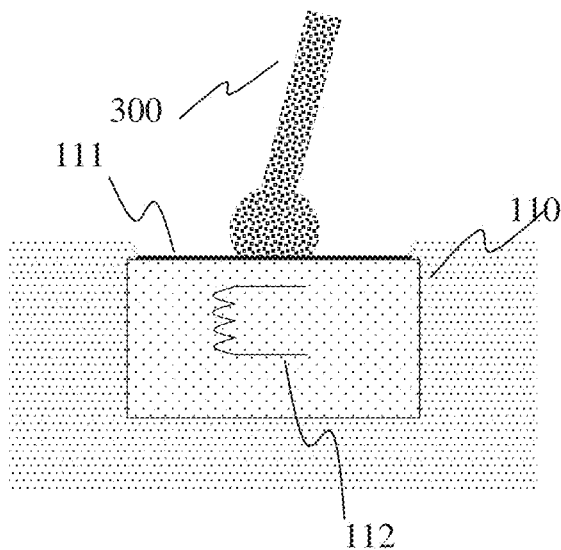
FIGS. 31 to 34 show uses of the connection structure for an integrated circuit according to different embodiments.
Figure 32:
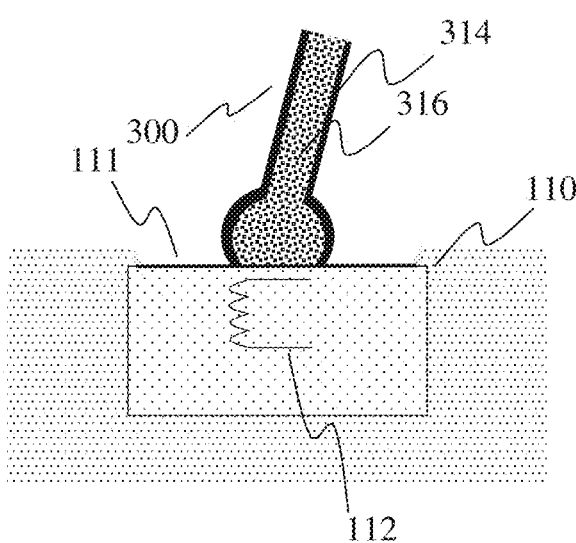

FIGS. 31 and 32 illustrate possible connections through wire bond. In FIG. 31, for the wirebond 300, a material having conductive and magnetic characteristics is used, so as to exploit both of the functionalities of the LPAD 110.

Alternatively, a conventional material can be used for the wire bond 300 if the only interest is in the electrical functionality of the connection structure 110. In this case, the inductor 112 can be used as a normal circuit element of the integrated circuit 100.

Moreover, as schematically illustrated in FIG. 32, in order to further exploit also the electromagnetic functionality of the connection structure 110, the purely conductive core 316 of the wire bond 300 can be coated with a covering 314 having magnetic and conductive characteristics. For example, this can be made by using a wire bond 300 with a core 316 made from copper coated, for example, with a coating 314 of nickel, cobalt, their alloys, or similar materials using, for example, a electroless process. Through the same electroless process, it is also possible to deposit material on the portion of the LPAD 110 not coated by the passivation of the integrated circuit. In a further variant, the wire bond 300 can be coated with a host material like, for example, a conductive substance like a conductive polymer in which particles having magnetic and also electrically conductive characteristics are dispersed.

Alternatively, for the wire bond 300, it is also possible to use a conventional material, inside of which there are particles of material having magnetic characteristics. Given that the LPAD 110 can be used to transport high currents like a conventional pad, in order to increase the performance of the connection structure 110, the particles of magnetic material present inside the wire bond 300 can also be electrically conductive.

Figure 33:
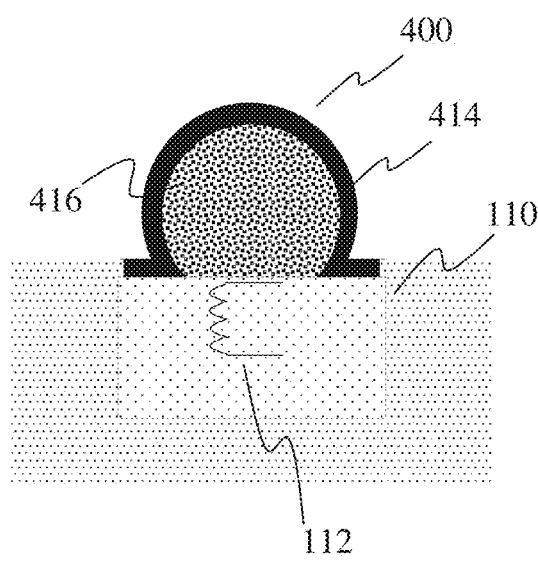
Figure 34:
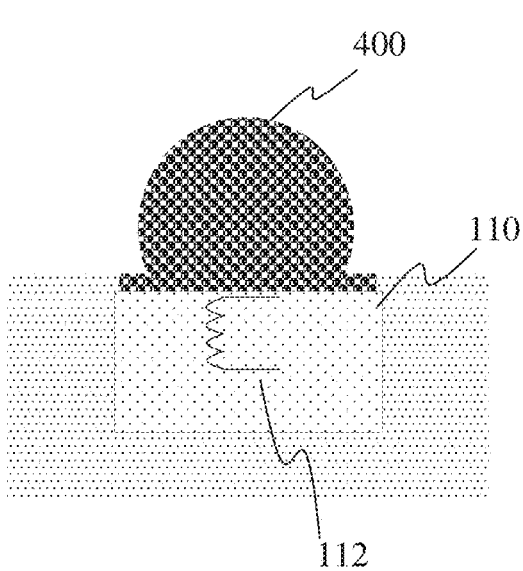

FIGS. 33 and 34 show an LPAD 110 according to an embodiment coupled to a bump 400 so as to have a structure suitable for being used in a flip chip assembly.

In particular, FIG. 33 shows a structure including an LPAD 110 and a bump 400 having a core of conventional material 416 coated with a covering 414 of material having conductive and magnetic characteristics.

Alternatively, as shown in FIG. 34, the bump 400 can be made using a conventional conductive material, like for example copper, aluminium or similar, containing particles of material having conductive and magnetic characteristics.

Although not shown in FIGS. 33 and 34, the bump 400 can also be formed from a material having conductive and magnetic characteristics like, for example, nickel, cobalt, and similar.

FIGS. 35 to 38 show at least one integrated circuit 100, including at least one connection structure 110, which is coupled to a substrate 500 so as to form a package according to alternative embodiments.

Figure 35:
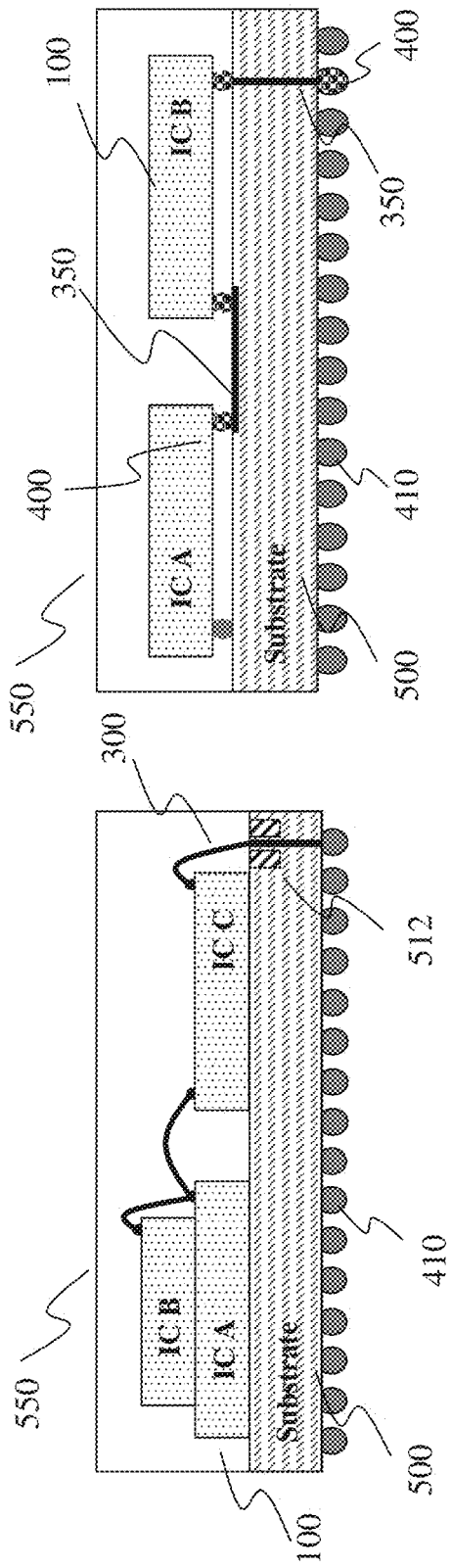
FIGS. 35 to 37 are schematic drawings illustrating microelectronic devices included in a container and including integrated circuits according to different alternative embodiments.

FIG. 35 shows a microelectronic container or package 550 where a plurality of integrated circuits 100 are coupled together and to conventional bumps 410 of a substrate 500 through wire bonds 300 having conductive and magnetic characteristics. The wire bonds 300 can be created in accordance with one of the embodiments described with reference to FIGS. 31 and 32 and they can be coupled to the generic LPAD 110 in a similar way to what has already been described earlier with reference to FIGS. 31 and 32 and be used in an analogous way to what has been described with reference to FIGS. 24 to 30 where the probe 200 is replaced by the wire bond 300. The substrate 500 of the package 550 includes an inductor 512 suitable for generating or absorbing energy through a magnetic field. In this way it is possible to generate a magnetic field between the inductor 112 of the LPAD 110 in the integrated circuit 100 and the inductor 512. Consequently, it is also possible to transmit information both electrically and electromagnetically through the wire bond 300, also allowing a single wire bond 300 to transport the power needed to make the integrated circuit 100 work, at least in part.

Figure 36:
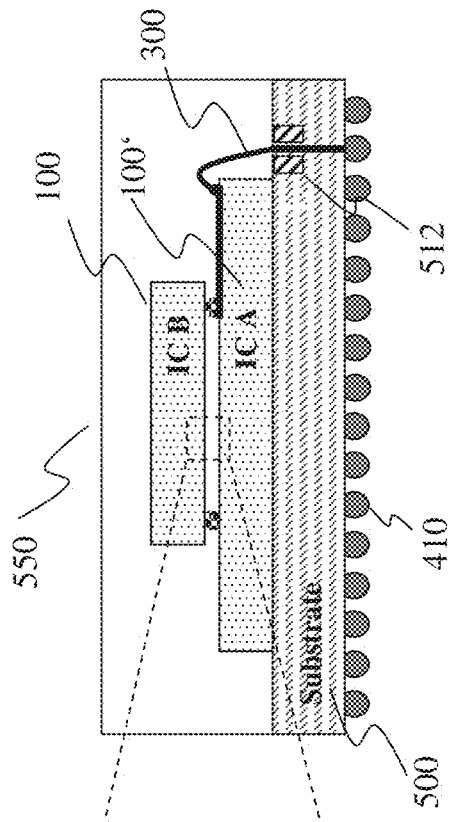
Figure 37:
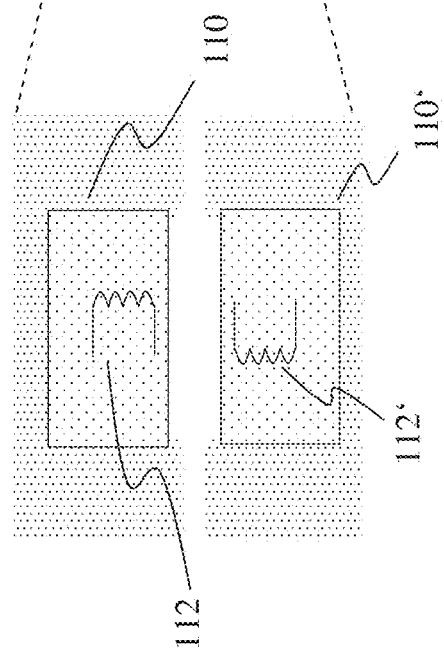

FIG. 36 shows a package 550 analogous to the package of FIG. 35 where the wire bonds 300 are replaced by bumps 400. The package 550 of FIG. 36 includes a plurality of paths or metallic strips 350 made from material having conductive and magnetic characteristics that can be formed on the surface of the substrate 500 or inside it. The strips 350 can couple, for example, through respective bumps 400, an integrated circuit 100 to the substrate 500 of the package 550 or two integrated circuits 100 to one another. In this way electric circuits can be formed inside or outside the package 550, and jointly electromagnetic circuits can also be created.

The connection structure 110 according to an embodiment can also be used in the final application of the chip 100. Indeed, it is possible to design a package where two chips 100 and 110' are arranged so as to have two connection structures 110 and 110', one in front of the other. In this way it is possible to use the inductors 112 and 112' of the two LPADs 110 and 110' to create a transformer. In addition, the two LPADs 110 and 110' can also be electrically coupled to one another, or else they can be insulated through an insulating or dielectric material or else there can be materials with magnetic characteristics, like, for example, a bump 400. The inductors 112 and 112' that form the two windings of the transformer can be galvanically insulated from one another. The embodiment described above is illustrated in FIG. 37.

The structure of an LPAD 110 according to an embodiment adapts to being used in applications for Energy Harvesting or Energy Scavenging, where by Energy Harvesting we refer to environments in which the energy source is well known, characterized and regular, whereas Energy Scavenging refers to environments in which the energy source is unknown and highly irregular. Indeed, the generic LPAD 110 can absorb electromagnetic energy thanks to the inductor 112 transforming it into electrical energy to be able to be used for the operation of at least part of the integrated circuit 100 thanks to suitable circuits coupled to the LPAD 110 that possibly can also at least partially store such energy.

Figure 38:
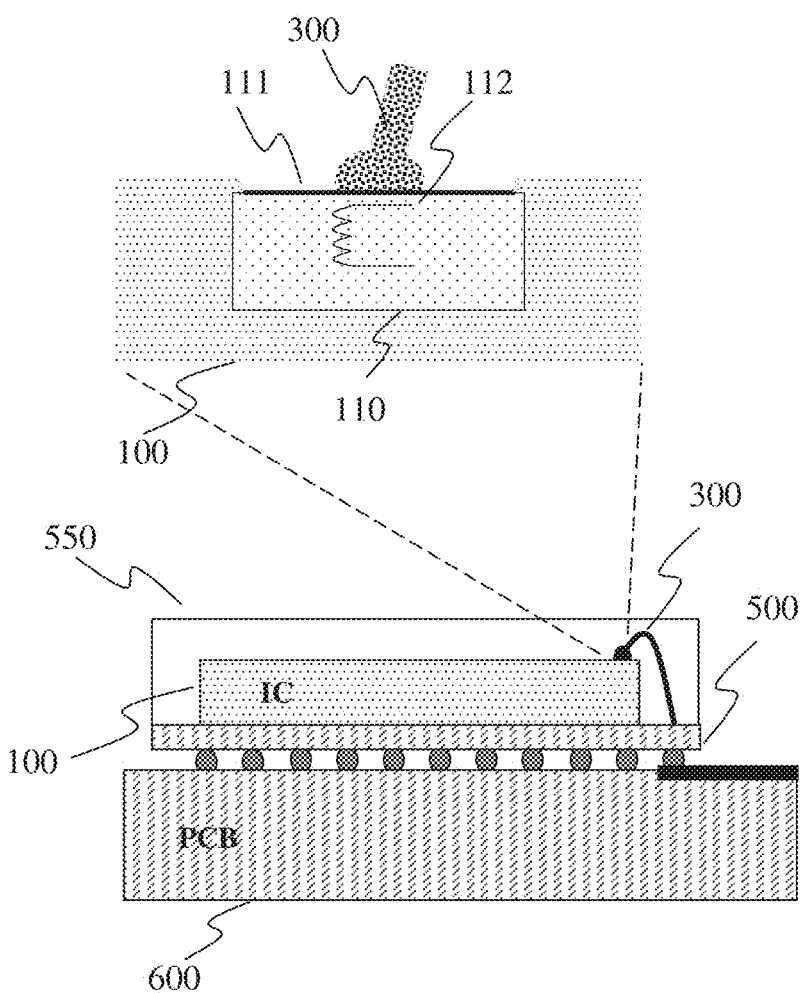
FIG. 38 is a diagram that illustrates a possible use of the connection structure according to an embodiment.
Figure 39:
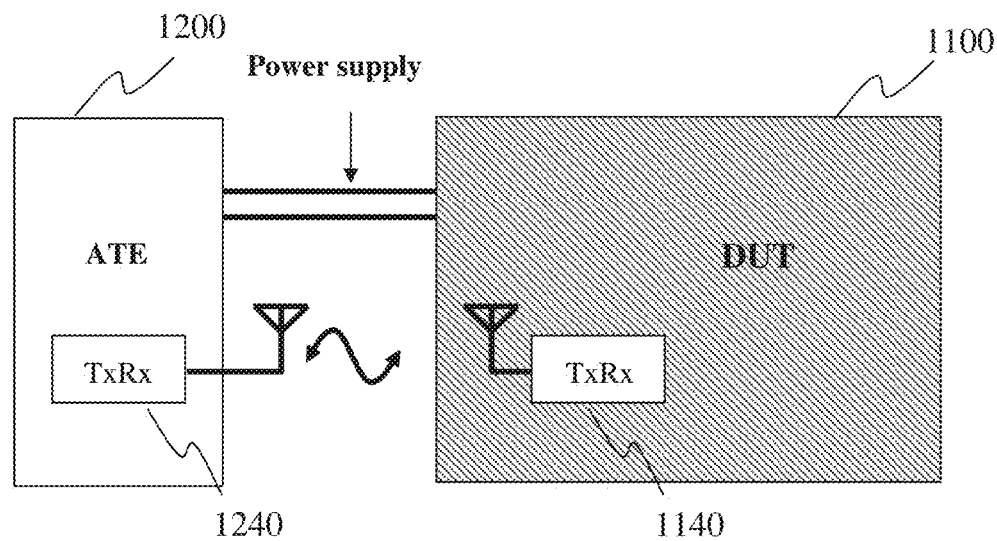
FIG. 39 is a schematic drawing illustrating a conventional testing system.
Figure 40:
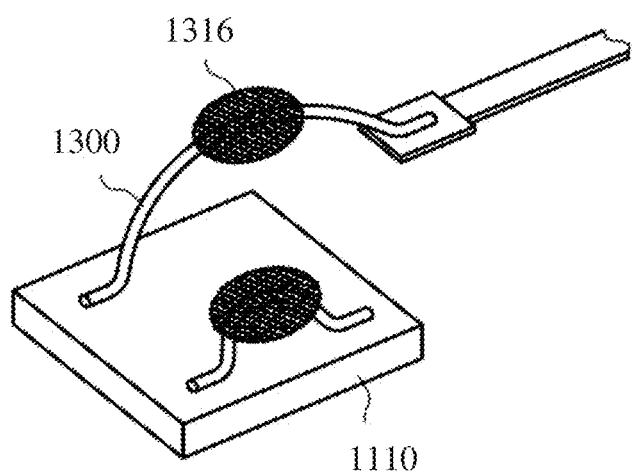
FIG. 40 is a schematic drawing illustrating a conventional connection pad.
Figure 41:
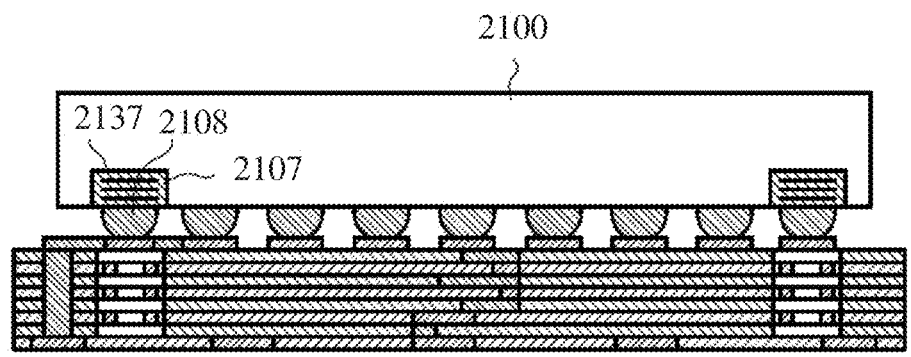
FIGS. 41 and 42 are schematic drawings illustrating integrated circuits including conventional connection structures.
Figure 42:
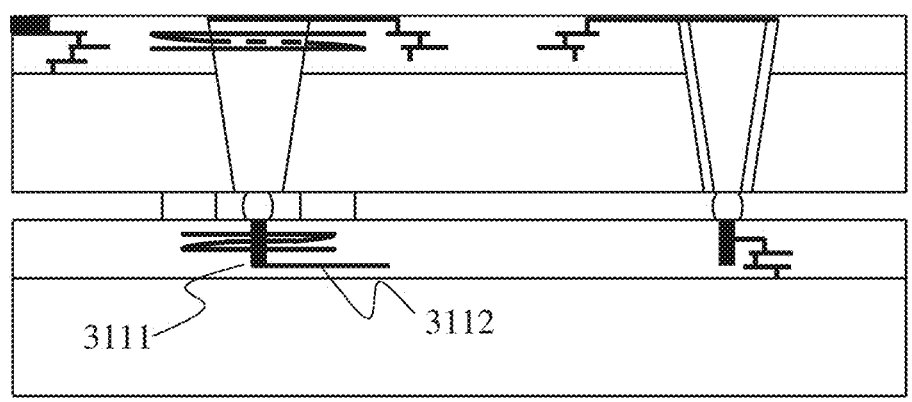

FIG. 38 shows a package including a chip 100 according to an embodiment mounted on a printed circuit board 600 (PCB). The integrated circuit 100 is coupled to the substrate 500 of the package 550 through a wire bond 300 with magnetic properties. In this case the wire bond 300 can also have, in addition to its normal functions described earlier, the function of an antenna so as to capture the environmental electromagnetic fields whose energy will then be converted into electrical energy. In addition, as well as the wire bond 300, the trace of the printed circuit board 600, to which the package 550 containing the chip 100 is coupled, can also be used as antennae capturing the environmental electromagnetic fields.

Moreover, the connection structure 110 can be used to capture the energy of disturbances or undesired events like for example spikes in voltage, current and similar, present on a line, for example a power line, and convert them into electrical energy.

A single LPAD 110 can also be used as a magnetic sensor, or else at least two LPADs 110 can be used, a first LPAD of which has the role of reference or excitation inductor generating a magnetic or electromagnetic field and a second LPAD has the role of a detection inductor. Optionally there can be materials with magnetic characteristics close to the single LPAD 110 or between the at least two LPADs, for example such a material can be arranged on the surface of the integrated circuit 100. This can be used, for example, in eddy current sensors and in fluxgate sensors. In addition, a plurality of LPADs 110 can be suitably arranged in an integrated circuit 100, for example, to obtain the direction of movement of a body that is altering the magnetic field emitted by the inductor of the reference LPAD that, for example, can be arranged at the center of the plurality of LPADs 110.

Moreover, an integrated circuit that includes one or more LPADs 110 may be a controller such as a processor.

Finally, the connection structure or LPAD 110 can be used as part of a wireless or wire line communication interface, and in particular as a communication interface over power lines.

In conclusion, an embodiment combines in a single structure a pad including a connection terminal suitable for coupling the circuit elements integrated in a chip to circuits outside the chip itself and at least one inductor that can be used, for example, to receive/transmit electromagnetic waves or to feed the chip or both, or can be used as a circuit element and yet more. By combining in a single structure a connection pad and an inductor it is possible to reduce the overall area that otherwise in common integrated circuits is occupied exclusively by the inductors, thus reducing their cost and size. The connection structure or LPAD according to an embodiment also makes it possible to carry out a wireless test of the devices on wafers, the "Final Test", the reliability test on wafers, in the jargon called WLBI or for testing failures on the customer application (customer returns). The chips that integrate the connection structure of an embodiment can be at least partially fed and exchange information thanks also to a single LPAD. Magnetic circuits can also be created inside and outside of the package.

Of course, in order to satisfy contingent and specific requirements, one can bring many modifications to the embodiments described earlier. Although embodiments have been described, it is clear that various omissions, replacements, and modifications in the shape and in the details, just like other even hybrid embodiments, are possible also in combination with the prior art; it is expressly understood that specific elements and/or method steps described in relation to any embodiment described can be incorporated in any other embodiment and/or in combination with the prior art as general aspects of design choices.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
   an integrated circuit having a plurality of metallization layers;
   a connection terminal on an upper metallization layer of said plurality of metallization layers;
   a conductive element below the connection terminal, said conductive element configured to electrically couple the connection terminal to one or more circuit elements of the integrated circuit;
   an inductive element in at least one metallization layer of said plurality of metallization layers that are located below the upper metallization layer and surrounding at least part of said conductive element;
   a containment structure provided extending through said plurality of metallization layers and surrounding at least the inductive element, said containment structure configured to contain a magnetic field generated by the inductive element.

2. The apparatus of claim 1, wherein the inductive element is electrically coupled to the connection terminal.

3. The apparatus of claim 1, wherein the inductive element is electrically coupled to one or more circuit elements of the integrated circuit.

4. The apparatus of claim 1, wherein the conductive element comprises:
at least one discontinuous layer of metal provided within at least one metallization layer of said plurality of metallization layers that are located below the upper metallization layer;
said at least one discontinuous layer of metal comprising a plurality of sub-structures that are electrically insulated from each other at a level of said at least one metallization layer.

5. The apparatus of claim 4, wherein the inductive element in said at least one metallization layer passes between, and is insulated from, pairs of sub-structures of said at least one discontinuous layer of metal.

6. The apparatus of claim 4, wherein the inductive element in said at least one metallization layer has a coil shape which surrounds plural ones of said plurality of sub-structures.

7. The apparatus of claim 6, wherein plural other ones of said plurality of sub-structures are not surrounded by the coil shape of the inductive element.

8. The apparatus of claim 4, wherein the inductive element in said at least one metallization layer has a coil shape which surrounds all of said plurality of sub-structures.

9. The apparatus of claim 4, further comprising a plurality of vias configured to support making of an electrical coupling of each sub-structure of the plurality of sub-structures of said at least one discontinuous layer of metal to the connection terminal.

10. The apparatus of claim 4, further comprising a plurality of vias configured to support making of an electrical coupling of each sub-structure of the plurality of sub-structures of said at least one discontinuous layer of metal.

11. The apparatus of claim 1, wherein the connection terminal includes a magnetic material.

12. The apparatus of claim 11, wherein the connection terminal includes a plurality of fingers and wherein said magnetic material extends in gaps between fingers.

13. The apparatus of claim 1, wherein the containment structure includes an insulating material covered by a layer of magnetic material.

14. The apparatus of claim 1, wherein the containment structure includes a conductive material and is discontinuous along a perimeter that surrounds the inductive element.

15. The apparatus of claim 1, wherein the containment structure includes a plurality of magnetic vias formed on different metallization layers of said plurality of metallization layers so as to surround the inductive element.

16. The apparatus of claim 1, wherein the conductive element includes a magnetic material and the containment structure is formed by the conductive element.

17. The apparatus of claim 1, wherein the connection terminal and the conductive element include a magnetic material.

18. The apparatus of claim 1, wherein the connection terminal is coupled to a first circuit and the inductive element is coupled to a second circuit.

19. The apparatus of claim 15, wherein the first and the second circuit are integrated in the integrated circuit and include at least one of a receiving, transmitting, or power supply circuit, or a combination thereof.

20. The apparatus of claim 1, wherein the conductive element comprises a conductive structure extending through a first number of metallization layers of said plurality of metallization layers, wherein the inductive element in said at least one metallization layer has a coil shape which surrounds the conductive structure on second number of metallization layers of said plurality of metallization layers, wherein said second number is less than said first number.

21. The apparatus of claim 20, wherein the conductive structure is formed by a stack of alternating sub-structures and vias.

22. The apparatus of claim 1, wherein the containment structure is formed within a trench that extends through at least some of said plurality of metallization layers and wherein the trench has sidewalls lined with a layer of magnetic material.

23. The apparatus of claim 1, wherein the containment structure is formed within a trench that extends through at least some of said plurality of metallization layers and wherein the trench is filled with a magnetic material.

24. The apparatus of claim 1, wherein the containment structure is formed within a trench that extends through at least some of said plurality of metallization layers and wherein the trench is filled with a conductive material.

25. The apparatus of claim 1, wherein the containment structure is formed within a trench that extends through at least some of said plurality of metallization layers and wherein the trench is filled with a combination of a magnetic material and a conductive material.

26. The apparatus of claim 1, wherein the containment structure is formed within a trench that extends through at least some of said plurality of metallization layers and wherein the trench is filled with an insulating material including magnetic particles.

27. The apparatus of claim 1, wherein the containment structure is formed within a trench that extends through at least some of said plurality of metallization layers and wherein the trench is filled with an insulating material with magnetic characteristics.

28. The apparatus of claim 1, wherein the containment structure is formed by a plurality of disconnected segments arranged to substantially surround the inductive element.

* * * * *